(12) United States Patent
Sugiyama et al.

(10) Patent No.: US 10,674,601 B2
(45) Date of Patent: Jun. 2, 2020

(54) PRINTED WIRING BOARD AND CAMERA MODULE

(71) Applicant: TAIYO YUDEN CO., LTD., Tokyo (JP)

(72) Inventors: Yuichi Sugiyama, Tokyo (JP); Masashi Miyazaki, Tokyo (JP); Hiroyuki Kobayashi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/011,203

(22) Filed: Jun. 18, 2018

(65) Prior Publication Data

US 2018/0310401 A1 Oct. 25, 2018

Related U.S. Application Data

(63) Continuation of application No. PCT/JP2016/088564, filed on Dec. 22, 2016.

(30) Foreign Application Priority Data

Dec. 25, 2015 (JP) ................................ 2015-253754

(51) Int. Cl.
*H05K 1/02* (2006.01)
*H05K 1/05* (2006.01)
(Continued)

(52) U.S. Cl.
CPC ......... *H05K 1/0271* (2013.01); *H04N 5/2253* (2013.01); *H04N 5/2258* (2013.01);
(Continued)

(58) Field of Classification Search
CPC ...... H05K 1/0271; H05K 1/111; H05K 1/181; H05K 1/05; H05K 3/0052; H05K 3/445;
(Continued)

(56) References Cited

U.S. PATENT DOCUMENTS

2003/0124763 A1\* 7/2003 Fan .................. H01L 27/14621
438/70
2005/0270405 A1\* 12/2005 Tanida .............. H01L 27/14618
348/340
(Continued)

FOREIGN PATENT DOCUMENTS

CN 103648233 A 3/2014
JP S62-52988 A 3/1987
(Continued)

OTHER PUBLICATIONS

Texas Instruments DM385 and DM388 DaVinci Digital Media Processor Data Sheet (Rev. D), Dec. 2013 (Year: 2013).\*
(Continued)

*Primary Examiner* — Timothy J Henn
(74) *Attorney, Agent, or Firm* — Osha Liang LLP

(57) ABSTRACT

A printed wiring board for camera module includes: first and second mounting regions for first and second image pickup devices respectively provided on one and the other sides in a front surface of the printed wiring board, the first and second mounting regions respectively provided with first and second conductive patterns configured to be electrically connected to the first and second image pickup devices, respectively, and a component mounting region provided between the first mounting region and the second mounting region, the component mounting region provided with a third conductive pattern, the third conductive pattern configured to be electrically connected to a signal processing component, amounting density of the third conductive pattern in the component mounting region being higher than that of the first conductive pattern in the first mounting region or a mounting density of the second conductive pattern in the second mounting region, in a plan view.

7 Claims, 13 Drawing Sheets

(51) Int. Cl.
*H05K 1/11* (2006.01)
*H05K 1/18* (2006.01)
*H05K 3/00* (2006.01)
*H05K 3/44* (2006.01)
*H04N 5/225* (2006.01)
*H01L 27/146* (2006.01)

(52) U.S. Cl.
CPC ............ *H05K 1/02* (2013.01); *H05K 1/05* (2013.01); *H05K 1/111* (2013.01); *H05K 1/181* (2013.01); *H05K 3/00* (2013.01); *H05K 3/0052* (2013.01); *H05K 3/445* (2013.01); *H01L 27/14618* (2013.01); *H05K 2201/0347* (2013.01); *H05K 2201/0358* (2013.01); *H05K 2201/09054* (2013.01); *H05K 2201/09136* (2013.01); *H05K 2201/09227* (2013.01); *H05K 2201/10121* (2013.01)

(58) Field of Classification Search
CPC . H05K 2201/09227; H05K 2201/0358; H05K 2201/0347; H05K 2201/09136; H05K 2201/10121; H05K 2201/09054; H04N 5/2253; H04N 5/2258
See application file for complete search history.

(56) References Cited

U.S. PATENT DOCUMENTS

| | | | | |
|---|---|---|---|---|
| 2006/0076472 | A1* | 4/2006 | Dosluoglu | H04N 13/239 250/208.1 |
| 2009/0058993 | A1* | 3/2009 | Lee | H04N 13/239 348/49 |
| 2009/0066797 | A1* | 3/2009 | Miyachi | H04N 5/2251 348/207.99 |
| 2010/0213611 | A1* | 8/2010 | Isa | H01L 23/13 257/738 |
| 2010/0304176 | A1* | 12/2010 | Watanabe | C25D 5/34 428/596 |
| 2011/0073750 | A1* | 3/2011 | Nagano | H01L 27/12 250/208.1 |
| 2011/0260035 | A1* | 10/2011 | Seger | H04N 5/2254 250/208.1 |
| 2011/0290408 | A1* | 12/2011 | Samejima | H05K 3/445 156/182 |
| 2012/0019624 | A1* | 1/2012 | Park | H04N 5/2253 348/47 |
| 2013/0182163 | A1* | 7/2013 | Kobayashi | H01L 27/14601 348/302 |
| 2013/0265394 | A1* | 10/2013 | Lim | H04N 5/2253 348/46 |
| 2014/0048321 | A1* | 2/2014 | Sugiyama | H05K 1/16 174/260 |
| 2014/0126157 | A1* | 5/2014 | Sawatari | H01L 23/552 361/728 |
| 2015/0181698 | A1* | 6/2015 | Suganuma | H04N 5/2253 250/208.1 |

FOREIGN PATENT DOCUMENTS

| | | |
|---|---|---|
| JP | 108-288660 A | 11/1996 |
| JP | 2000-101245 A | 4/2000 |
| JP | 2004-214271 A | 7/2004 |
| JP | 2007-273648 A | 10/2007 |
| JP | 2011-171658 A | 9/2011 |
| JP | 2014-112649 A | 6/2014 |
| JP | 2014-170183 A | 9/2014 |
| WO | 2006-046396 A1 | 5/2006 |

OTHER PUBLICATIONS

APTINA MT9P031: 1/2.5-Inch 5Mp Digital Image Sensor Data Sheet (Rev. G), 2005 (Year: 2005).*
Wikipedia—Low-voltage differential signaling, obtained from https://en.wikipedia.org/wiki/Low-voltage_differential_signaling on Sep. 2, 2018 (Year: 2018).*
ON Semiconductor 1/3-Inch 3.1 Mp/Full HD Digital Image Sensor AR0331 Datasheet, Rev. L, 5/15 (Year: 2015).*
Texas Instrucments SN65LVDS324 1080p60 Image Sensor Receiver, SLLSED9B—Nov. 2012, Revised Jul. 2015 (Year: 2015).*
International Search Report for corresponding International Application No. PCT/JP2016/088564, dated Mar. 14, 2017 (5 pages).
Notification of Reasons for Refusal in counterpart Japanese Patent Application No. 2017-534847, dated Aug. 21, 2017 (11 pages).
Decision to Grant a Patent in corresponding Japanese Patent Application No. 2017-534847, dated Oct. 6, 2017 (5 pages).
Office Action in corresponding Chinese Patent Application No. 201680076112.2 dated Dec. 5, 2018 (8 pages).

* cited by examiner

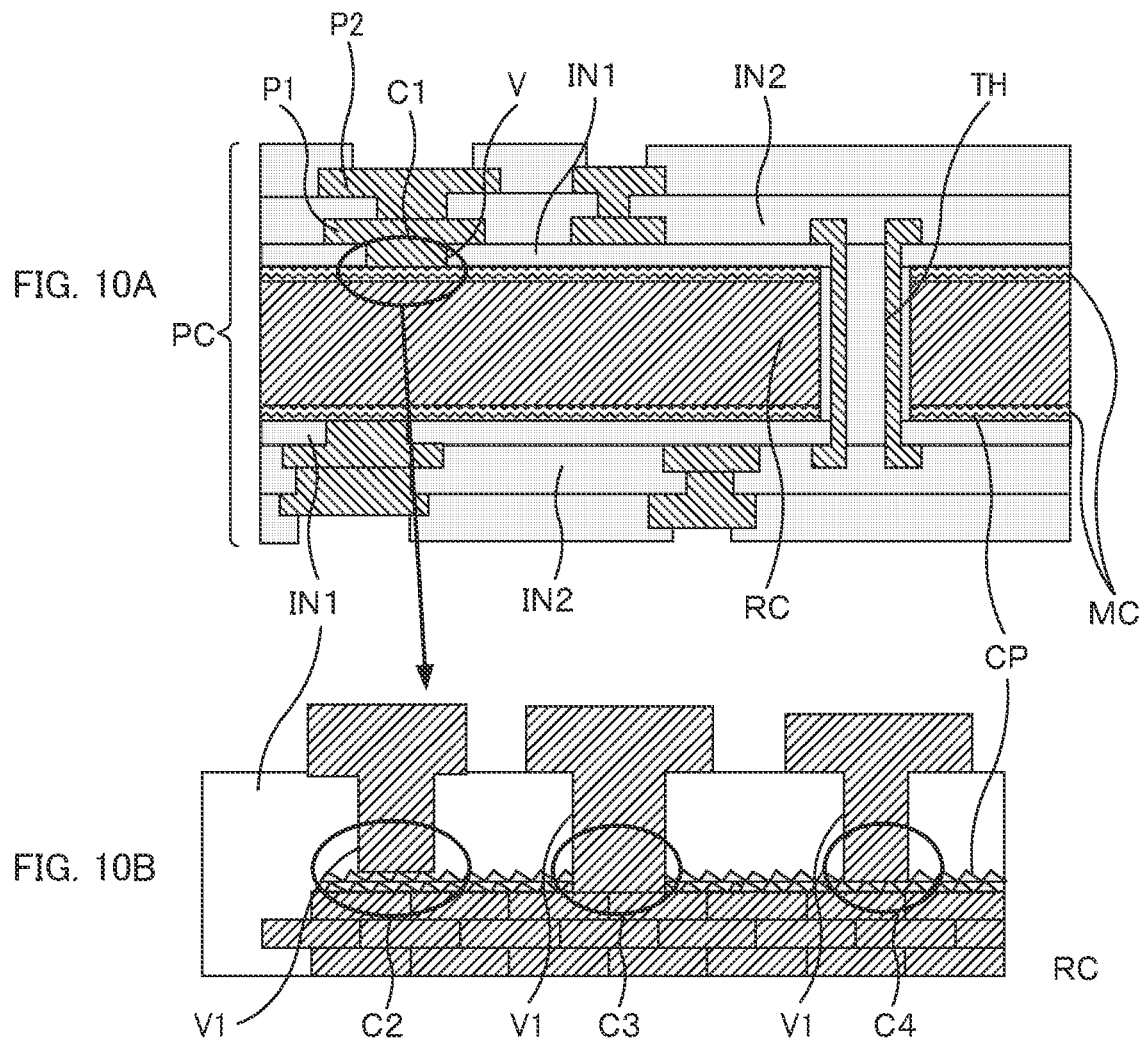
FIG. 10A
FIG. 10B
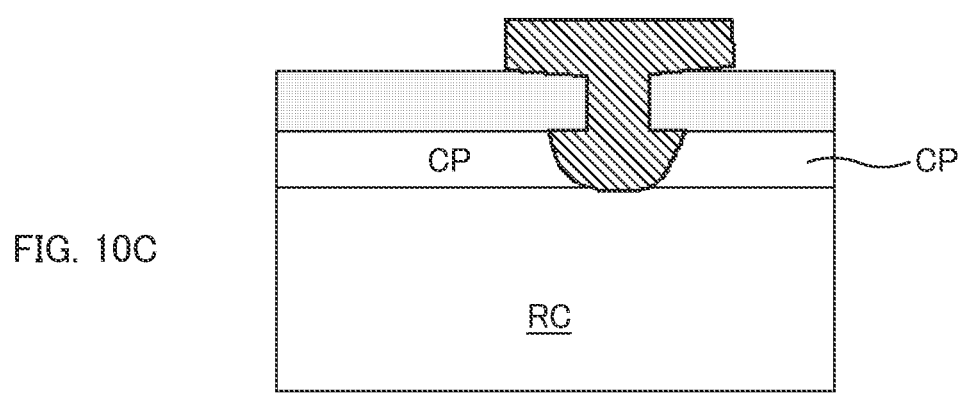
FIG. 10C

PRINTED WIRING BOARD AND CAMERA MODULE

CROSS-REFERENCE TO RELATED APPLICATIONS

This is a continuation application of International Patent Application No. PCT/JP2016/088564 filed Dec. 22, 2016, which claims the benefit of priority to Japanese Patent Application No. 2015-253754 filed Dec. 25, 2015. The full contents of the International Patent Application are incorporated herein by reference.

BACKGROUND

Technical Field

The present disclosure relates to a printed wiring board and a camera module.

Background Art

For example, a printed wiring board including a metal core is known (e.g., Japanese Patent Publication Nos. S62-052988 and 2000-101245).

SUMMARY

A rectangular printed wiring board for camera module according to an embodiment of the present disclosure comprises:
a metal core substrate including an individual piece having a rectangular front surface and a rectangular back surface, and four side surfaces connecting the front surface and the back surface; an insulation layer provided to each of a front surface and a back surface of the metal core substrate, the insulation layer being made of an insulating resin containing a filler; and a conductive pattern provided to the insulation layer provided each on the front surface and the back surface, the printed wiring board further comprising a first mounting region being a mounting region of a first image pickup device, the first mounting region provided on one side in a longitudinal direction in a front surface of the printed wiring board, the first mounting region having a first conductive pattern provided therein, the first conductive pattern configured to be electrically connected to the first image pickup device, a second mounting region being a mounting region of a second image pickup device, the second mounting region provided on another side in the longitudinal direction in the front surface of the printed wiring board, the second mounting region having a second conductive pattern provided therein, the second conductive pattern configured to be electrically connected to the second image pickup device, and a component mounting region being a mounting region of a signal processing component, the component mounting region provided between the first mounting region and the second mounting region, the component mounting region having a third conductive pattern provided therein, the third conductive pattern configured to be electrically connected to the component, a mounting density of the third conductive pattern in the component mounting region being higher than a mounting density of the first conductive pattern in the first mounting region or a mounting density of the second conductive pattern in the second mounting region, in a plan view.

BRIEF DESCRIPTION OF THE DRAWINGS

FIGS. 10A, 10B, and 10C illustrate a metal core substrate that employs a rolled Cu layer and a copper plating film.

DETAILED DESCRIPTION

Figure 1A:
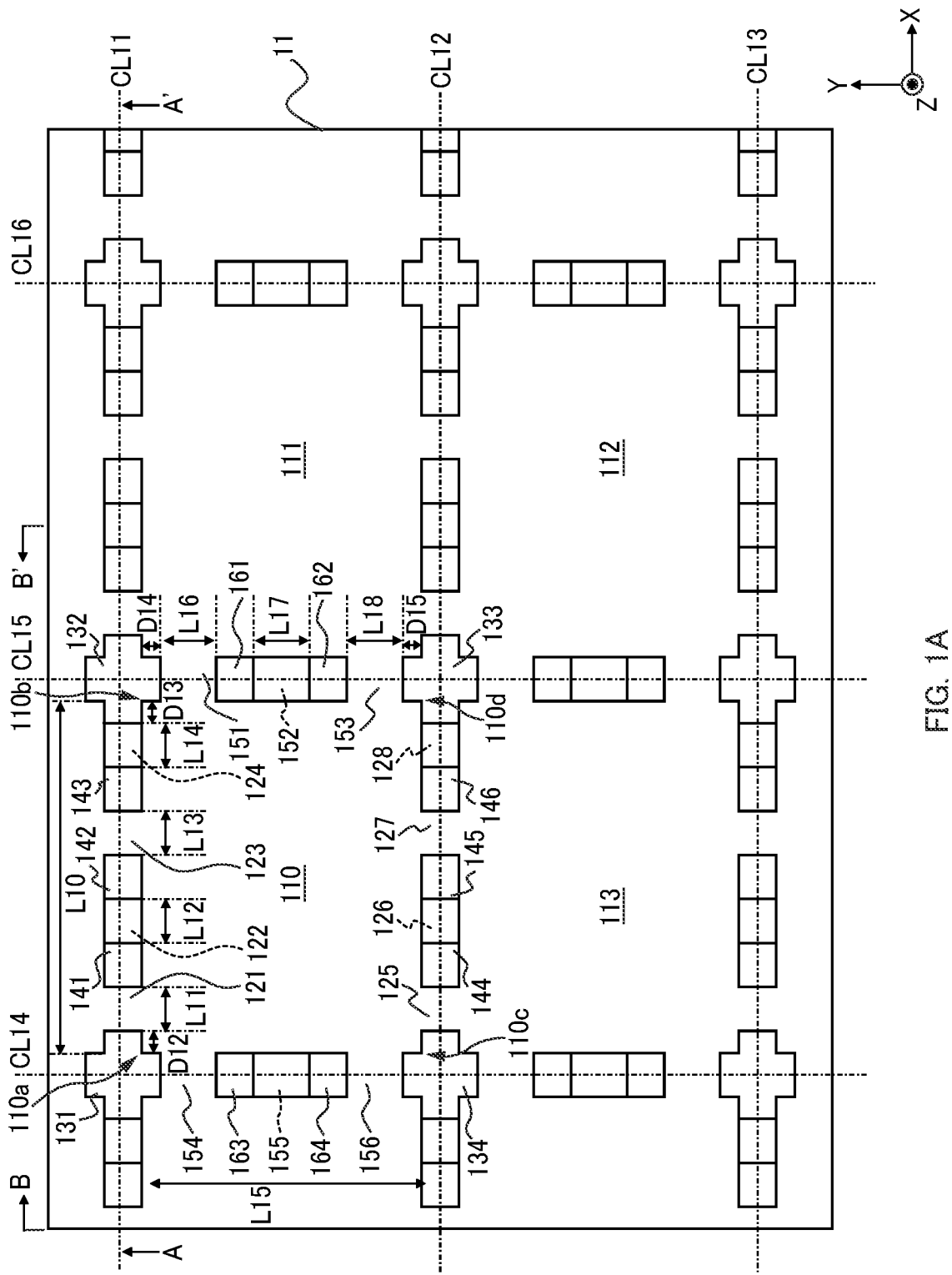
FIG. 1A is a plan view schematically illustrating a metal core substrate constituting a substrate according to a first embodiment.

A printed wiring board according to an embodiment of the present disclosure will be described below with reference to drawings as appropriate. Here, the printed wiring board will be described as being suitably used as a printed wiring board for a camera module. However, the printed wiring board according to an embodiment of the present disclosure is applicable to those other than a camera module.

It should be noted that, in the drawings, common or similar components are given the same or similar reference numerals.

First Embodiment

Figure 1B:
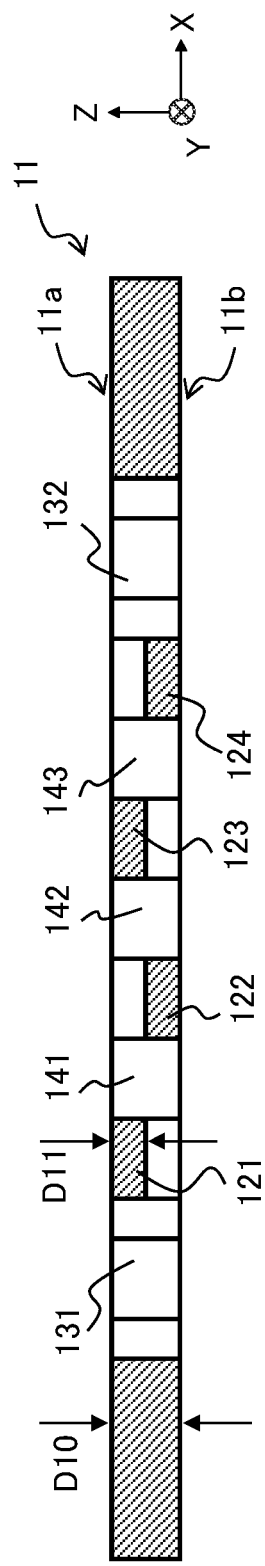
FIG. 1B is a cross-sectional view taken along line A-A' in a range of B-B' in FIG. 1A.

A printed wiring board 10 according to a first embodiment of the present disclosure will be described with reference to FIGS. 1A, 1B, and 2. FIG. 1A a plan view schematically illustrating a metal core substrate 11 constituting the printed wiring board 10. FIG. 1B is a cross-sectional view taken along line A-A' in a range of B-B' in FIG. 1A. However, in order to facilitate understanding of the cross-sectional structure of an individual piece 110, protruding pieces and hole portions belonging to other individual pieces are omitted. Further, FIG. 2 is a cross-sectional view schematically illustrating a portion of the printed wiring board 10 corresponding to that in FIG. 1B.

Figure 2:
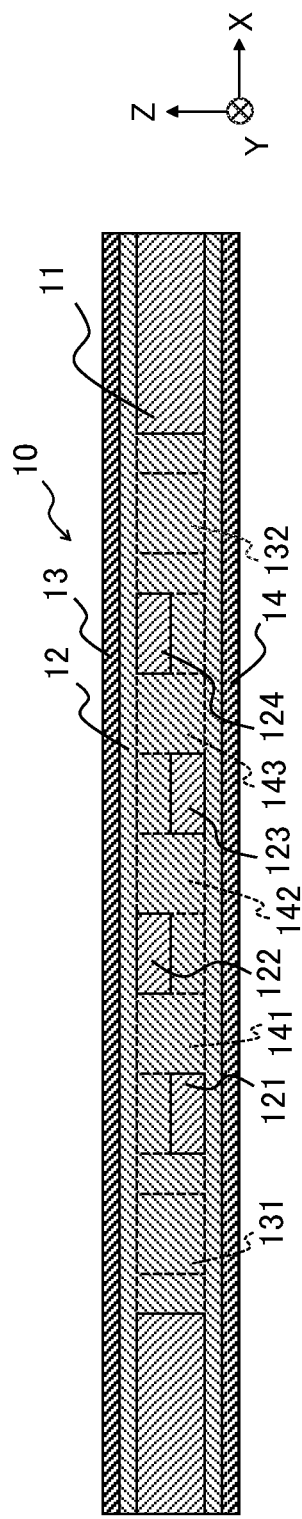
FIG. 2 is a cross-sectional view schematically illustrating a portion corresponding to that in FIG. 1B in a printed wiring board according to a first embodiment.

Here, in FIGS. 1A, 1B, and 2, the thickness direction of the printed wiring board 10 is defined as the Z-axis direction. Further, it is assumed that the printed wiring board 10 is disposed such that an upper surface 11a and a lower surface 11b of the metal core substrate 11 are parallel to an XY-plane orthogonal to the Z-axis. Further, it is assumed that a plurality of individual pieces 110 to 113 included in the printed wiring board 10 is disposed along the X-axis parallel to planned cutting lines CL11 to CL13 and the Y-axis parallel to planned cutting lines CL14 to CL16 orthogonal to the planned cutting lines CL11 to CL13.

<Configuration of Printed Wiring Board>

The printed wiring board 10 is suitably used as a printed wiring board for a camera module, and includes the metal core substrate 11, an insulation layer 12, and a solder resist layer 13, 14, as illustrated in FIG. 2. Note that the printed wiring board 10 includes signal wiring and a conductor via that are not shown. Further, the printed wiring board 10 may be a so-called multilayer printed wiring board configured such that the insulation layer 12 and a conductor pattern including the signal wiring are laminated onto the front and back of the substrate in a repeated (alternate) manner while being insulated with the insulation layers 12.

Metal Core Substrate

The metal core substrate 11 is a plate-shaped member constituted by, for example, a copper member, and provides stiffness to the printed wiring board 10. In an embodiment of the present disclosure, the metal core substrate 11 has a thickness equal to or smaller than 250 μm, for example, 210 μm, 160 μm, or 120 μm. Note that the metal core substrate 11 doubles as ground wiring.

The metal core substrate 11 includes a plurality of individual pieces. The single metal core substrate 11 includes a large number of individual pieces, but here, a description will be given assuming that the metal core substrate 11 includes four individual pieces 110 to 113, for convenience sake. The plurality of individual pieces 110 to 113 has a quadrangular shape, and aligned in the X-axis direction (first direction) and the Y-axis direction (second direction). Only the predetermined number of the plurality of individual pieces 110 to 113 may be aligned in the X-axis direction and the Y-axis direction. The plurality of individual pieces 110 to 113 has the same shape.

Further, the metal core substrate 11 includes protruding pieces. The protruding pieces are members to connect the individual pieces adjacent to each other, and are provided integrally with the individual pieces. As described above, the plurality of individual pieces 110 to 113 has the same shape. Thus, when describing the protruding pieces 121 to 128 and 151 to 156 related to the individual piece 110, the protruding pieces 121 to 128 and 151 to 156 extend from the sides of the individual piece 110, to connect the sides adjacent to each other of the individual pieces (111, 113, etc.) adjacent to each other.

The protruding pieces 121 to 124 are provided along the planned cutting line CL11, while protruding pieces 125 to 128 are provided along the planned cutting line CL12. Further, protruding pieces 151 to 153 are provided along the planned cutting line CL15, while protruding pieces 154 to 156 are provided along the planned cutting line CL14. As a result, the individual piece 110 surrounded by these protruding pieces 121 to 128 and 151 to 156 has a substantially rectangular shape that is formed by the lines along the planned cutting lines CL11, CL12, CL14, and CL15. Note that the planned cutting lines CL11 to CL16 are virtual lines, and the printed wiring board 10 is cut into the individual pieces along such virtual lines using, for example, a dicer.

Considering that the blade of such a dicer has a predetermined width, and that the positions at which the printed wiring board 10 is cut by a dicer may deviate from the planned cutting lines CL11 to CL16, the planned cutting lines CL11 to CL16 may be defined to have a predetermined width.

Here, in the individual piece 110, four sides along the planned cutting lines CL11, CL12, CL14, CL15 are formed from cross-shaped hole portions 131 to 134 and hole portions 141 to 146 and 161 to 164 in addition to the above described protruding pieces 121 to 128 and 151 to 156. The cross-shaped hole portions 131 to 134 are formed at positions at which the planned cutting lines CL11, CL12, CL14, CL15 intersect each other. Then, the protruding pieces 121 to 128 and 151 to 156 and the hole portions 141 to 146 and 161 to 164 each are alternately disposed between the cross-shaped hole portions 131 to 134. For example, on the side along the planned cutting line CL11 of the individual piece 110, the cross-shaped hole portion 131, the protruding piece 121, hole portion 141, the protruding piece 122, the hole portion 142, the protruding piece 123, the hole portion 143, the protruding piece 124, and the cross-shaped hole portion 132 are aligned, in this order. Further, on the side along the planned cutting line CL15 of the individual piece 110, the cross-shaped hole portion 132, the protruding piece 151, the hole portion 161, the protruding piece 152, the hole portion 162, the protruding piece 153, and the cross-shaped hole portion 132 are aligned in this order. Similarly, on the sides opposed to theses sides, the cross-shaped hole portions 131, 133, and 134, the protruding pieces 125 to 128 and 154 to 156, and the hole portions 144 to 146 and 163 to 164 are disposed.

Accordingly, the plurality of protruding pieces 121 to 128 and 151 to 156 are provided, at predetermined intervals, to the four sides formed in the individual piece 110. Here, the predetermined intervals indicate a distance between the protruding pieces 121 to 128 and 151 to 156 adjacent each other (e.g., a distance between the protruding pieces 121 and 122), and corresponds to the length of the hole portions 141 to 143 along the planned cutting line CL11. It is preferable that such a predetermined interval is, for example, equal to or greater than the thickness D11 of the protruding pieces 121 to 128 and 151 to 156. This predetermined interval is provided to prevent a short circuit which is caused such a burr, formed when cutting the protruding pieces 121 to 128 and 151 to 156 using, for example, a dicer, come in contact with the protruding pieces 121 to 128 and 151 to 156.

Then, the protruding pieces 121, 124, 125, 128, 151, 153, 154, 156 (i.e., the protruding pieces most closest to corner portions 110a to 110d of the individual piece 110 in each of the sides) are provided, at positions at which an offset corresponding to the thickness D11 of the protruding pieces 121 to 128 is provided with respect to the corner portions 110a to 110d of the individual piece 110, that is, at positions distant by D12 to D15, respectively, from the corner portions 110a to 110d. For example, it is preferable that offsets D12 to D15 are provided to have a length of 105 μm in the metal core substrate 11 having a thickness of 210 μm, a length of 80 μm in the metal core substrate 11 having a thickness of 160 μm, or a length of 60 μm in the metal core substrate 11 having a thickness of 120 μm. Accordingly, the burr formed when cutting the protruding pieces 121 to 128 and 151 to 156 using, for example, a dicer can be prevented from extending to the outside of the individual piece 110 to damage other individual pieces and/or manufacturing devices, fall and contaminate manufacturing processes, or other. However, if the offsets D12 to D15 are made longer, the corner portions 110a to 110d are likely to be caught on something, and/or the individual piece 110 may be warped. Thus, it is desirable that the offsets D12 to D15 have such a length at which such an event does not occur. The burrs produced by cutting the protruding pieces 121, 124, 125, 128, 151, 153, 154, 156 using a dicing apparatus (not shown) generally have a length of about the thickness D11 of the protruding pieces 121, 124, 125, 128, 151, 153, 154, 156, or at least a length of about a half the length of the protruding pieces 121, 124, 125, 128, 151, 153, 154, 156. Thus, it is possible to form the protruding pieces close to the corner portions, with the offsets D12 to D15 corresponding to the thickness D11 of the protruding pieces 121, 124, 125, 128, 151, 153, 154, 156. However, in the case in which the offsets D12 to D15 are made greater than D11, the offsets D12 to D15 are to be set at such a length as to prevent a large-scale printed wiring board from being warped and prevent the corner portions from being caught on other objects. For example, the length can be increased up to a value obtained by the following formula:

$$\text{offset} = L(2N+1) + W$$

where L is a length of the individual piece, N is the number of protruding pieces (bridges), and W is the length of the bridges along the side of the individual piece.

As illustrated in FIG. 1B, it is preferable that the thickness D11 of the protruding pieces 121 to 128 and 151 to 156 is smaller than the thickness D10 of the metal core substrate 11. The thickness D11 of the protruding pieces 121 to 128 and 151 to 156 is, for example, 105 μm in the metal core substrate 11 having a thickness of 210μ, 80 μm in the metal core substrate 11 having a thickness of 160 μm, or 60 μm in the metal core substrate 11 having a thickness of 120 μm. The protruding pieces 121 to 128 and 151 to 156 having the above-described thickness are formed such that, in the case of the protruding pieces 121 to 128, recesses are formed in the lower surface 11b of the metal core substrate 11, for example, by half etching and, in the case of the protruding pieces 151 to 156, recesses are formed in the upper surface 11a of the metal core substrate 11, for example, by half etching.

Further, the total length of the protruding pieces 121 to 128 and 151 to 156 along the side of the individual piece 110 (L11+L12+L13+L14, L16+L17+L18) is equal to or greater than 50% of the length L10, L15 of the sides, as expressed by the following formulas 1 and 2, and is, for example, equal to or greater than 400 μm.

$$L10 \leq (L11+L12+L13+L14) \times 2 \quad \text{(formula 1)}$$

$$L15 \leq (L16+L17+L18) \times 2 \quad \text{(formula 2)}$$

Further, protruding pieces adjacent to each other in the protruding pieces 121 to 128 and 151 to 156 in each side of the individual piece 110 are provided at positions different from each other in thickness direction of the metal core substrate 11, as illustrated in FIG. 1B. Specifically, the protruding pieces 121, 123, 125, 127, 151, 153, 154, and 156 are provided on the same plane as the upper surface 11a of the metal core substrate 11, while the protruding pieces 122, 124, 126, 128, 152, and 155 are provided on the same plane as the lower surface 11b of the metal core substrate 11.

Note that, in the metal core substrate 11, a through-hole and a dummy hole not shown are provided without providing a cavity. A punched portion can be formed by machining, such as punching and drilling, and chemical processing, such as etching.

Insulation Layer

The insulation layer 12 is formed on a surface of the metal core substrate 11. In the insulation layer 12, a wiring pattern is formed. The insulation layer 12 is made of a thermosetting synthetic resin having insulation properties, such as an epoxy resin, a polyimide, a bismaleimide triazine resin, or these resins containing reinforcing filler such as glass fibers.

Solder Resist Layer

The solder resist layer 13, 14 is an insulation film to protect a circuit pattern formed in the printed wiring board 10, and is formed on a surface of the insulation layer 12. The solder resist layer 13, 14 is made of, for example, a thermosetting epoxy resin. Further, such an electrode (not shown) provided on the front and back sides of the printed wiring board 10 is exposed on an opening portion (not shown) of the solder resist layer 13, 14.

Implementation of the above-described configuration or a manufacturing method which will be described below can strengthen the large-scale printed wiring board 10 even if the thickness of the metal core substrate 11 is reduced, thereby improving transportability and workability. In addition, stiffness and flatness can be achieved also as a printed wiring board divided into individual pieces.

Specifically, as a result of measurement using a singulated printed wiring board containing a filler without glass cloth having the total thickness of 274 μm including a copper core substrate having a thickness of 120 μm, the elastic modulus was about 23 GPa. A dynamic viscoelastic measurement device (RSA3, TI Instruments, Inc.) was used as a measuring device, and the individual piece was subjected to three-point bending test with gaps of 10 mm in the center of the wiring board of the individual piece. Similarly, as a result of a measurement using a filler-contained printed wiring board without glass cloth having the total thickness of 210 μm including a copper core substrate having a thickness of 60 μm, the elastic modulus was about 10 GPa.

It is understood that obtainment of such a degree of elastic modulus as these values improves stiffness and flatness, and further, strengthens the large-scale wiring board. Note that, in all the embodiments, a large-scale substrate and a large-scale wiring substrate are also referred to as an assembly substrate.

<Method of Manufacturing Printed Wiring Board>

A method of manufacturing the printed wiring board 10 including the above described configuration will be described.

First, the metal core substrate 11 is prepared. For example, the cross-shaped hole portions 131 to 134 and the hole portions 141 to 146 and 161 to 164 are formed in the upper surface 11a and the lower surface 11b of the metal core substrate 11, along the planned cutting lines CL11 to CL16 intersecting with one another. As a result, the protruding pieces 121 to 128 and 151 to 156 are formed in a discontinuous manner. The cross-shaped hole portions 131 to 134 and the hole portions 141 to 146 and 161 to 164 are formed such that the metal core substrate 11 is etched by, for example, a wet etching method. Further, the protruding pieces 121 to 128 and 151 to 156 are formed such that the metal core substrate 11 is half-etched by, for example, the wet etching method. In association therewith, a through-hole and a dummy hole not shown may be formed by etching. Note that a through-hole, a dummy hole, and the like will be described with reference to FIGS. 9 and 10.

Next, an insulating resin material is laminated onto the metal core substrate 11, to form the insulation layer 12. At such time, the cross-shaped hole portions 131 to 134 and the hole portions 141 to 146 and 161 to 164 as well as the recesses that are formed by half-etching to form the protruding pieces 121 to 128 and 151 to 156, are filled with an insulating material, so that the holes and recesses are filled therewith. Note that, when the insulation layer 12 is formed, a wiring layer not shown may be formed. Generally, a conductive pattern is formed on the insulation layer 12. Such a conductive pattern is insulated with an insulation layer and formed each on the front and back sides in the case of a two-layer printed board, while two each on the front and back sides in the case of four-layer printed circuit board. Note that the total number may be predetermined. Further, the conductive pattern on the front side and the conductive pattern on the back side are electrically connected through a through-hole, a Via, and/or the like.

Next, the solder resist layers 13, 14 are formed on the surfaces of the insulation layers 12. Then, the metal core substrate 11 is cut along the planned cutting lines CL11 to CL16 by, for example, a dicer into the individual pieces 110 to 113. Thereafter, camera components such as image pickup devices are mounted to the individual pieces 110 to 113. Then, a semiconductor element or a passive component, which is different from the image pickup device, is mounted in a region (hereinafter, referred to as the component mounting region), which is different from a region (hereinafter, referred to as the "device mounting region") in which the image pickup device is mounted. The device mounting region and the component mounting region will be described later in detail.

Accordingly, in the first embodiment, even if a burr is formed by cutting of the protruding pieces 121 to 128 and 151 to 156, such burr do not reach other protruding pieces. Thus, it is possible to suppress a burr from dropping. Further, since the protruding pieces 121 to 128 and 151 to 156 can be provided as close to the corner portions 110a to 110d as possible, it is possible to prevent damage caused by warpage during a process flow. Furthermore, since the protruding pieces 121 to 128 and 151 to 156 are able to have a greater width, it is easy to handle the printed wiring board 10 even if the metal core substrate 11 becomes thin. Further, since the thin metal core substrate 11 can be used, it is possible to obtain the metal core substrate 11 having stiffness.

Thus, when the printed wiring board 10 has a large size, the printed wiring board 10 is prevented from being caught on something or warped due to the protruding pieces 121 to 128 and 151 to 156, so that workability when manufacturing the printed wiring board 10 is enhanced. Further, since the metal core substrate 11 is made of a metal member such as copper, it is not broken, for example, as in the case of a ceramic core when being mounted to a casing of a cell phone. Further, it is possible to ensure stiffness as a camera module wiring board after dicing.

Second Embodiment

Figure 3A:
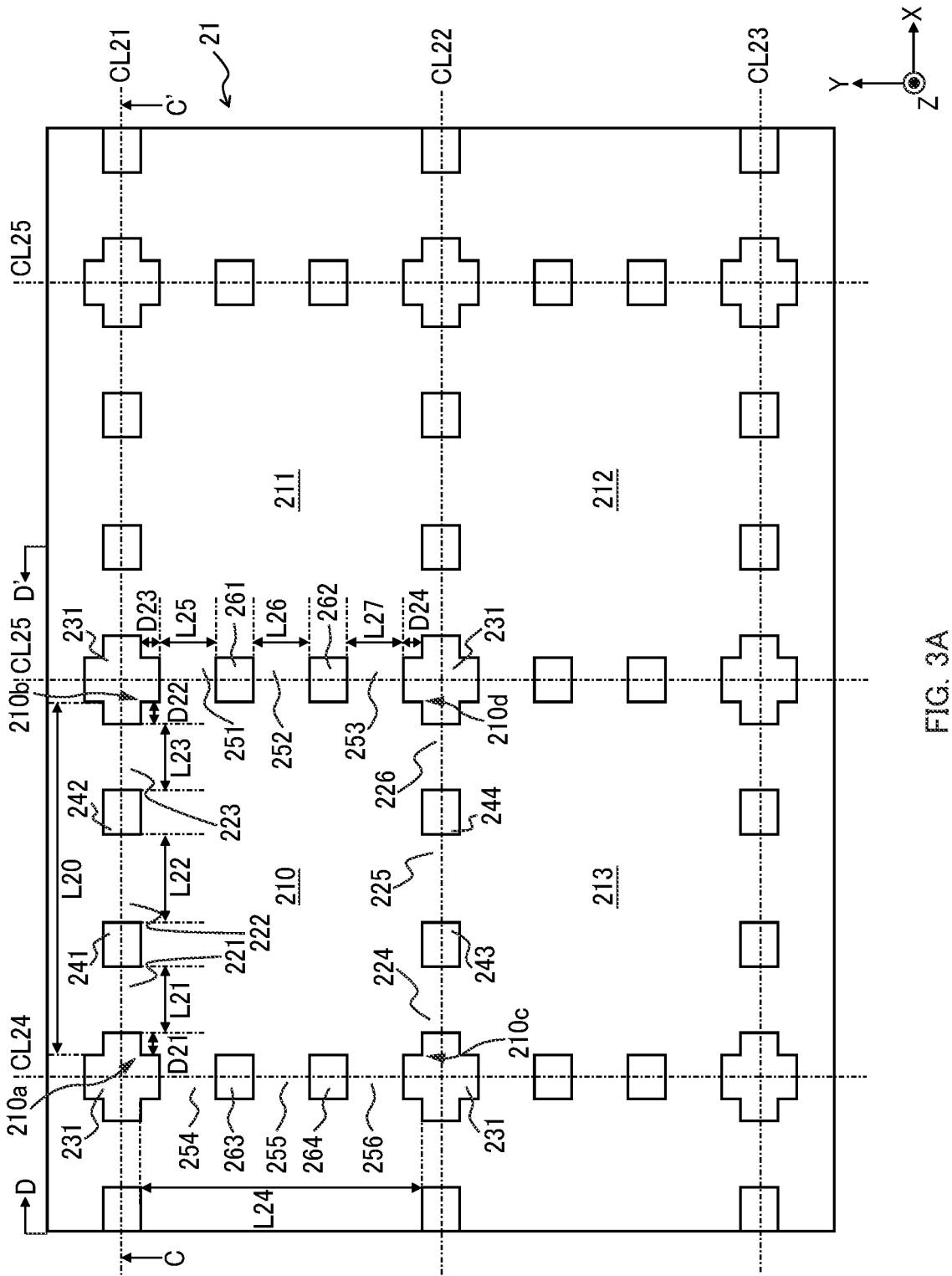
FIG. 3A is a plan view schematically illustrating a metal core substrate constituting a substrate according to a second embodiment.
Figure 3B:
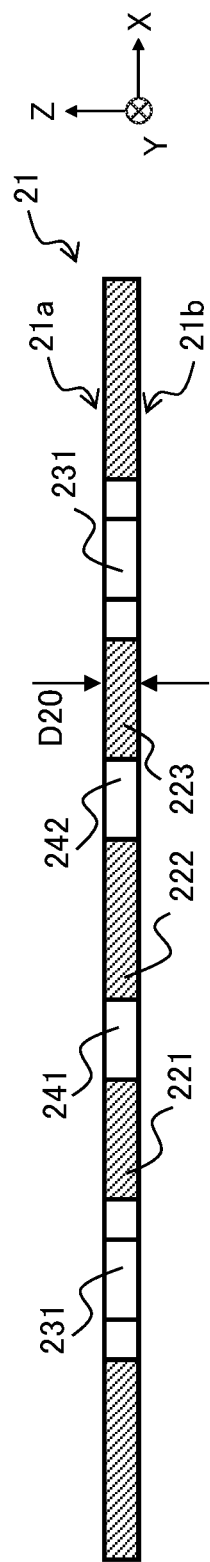
FIG. 3B is a cross-sectional view taken along line C-C' in a range of D-D' in FIG. 3A.
Figure 4:
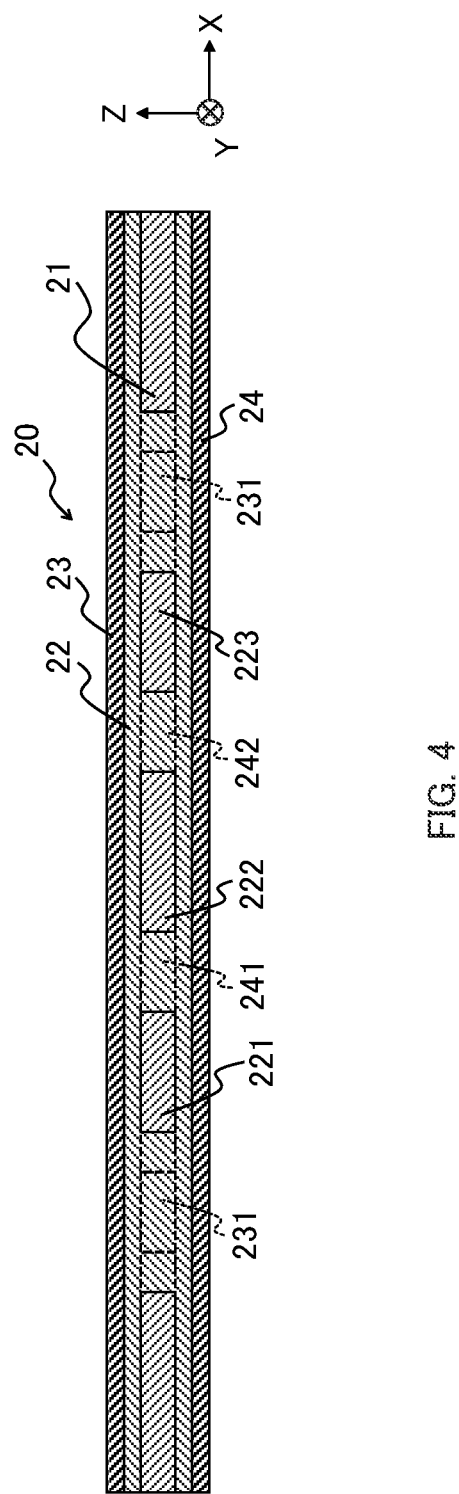
FIG. 4 is a cross-sectional view schematically illustrating a portion corresponding to that in FIG. 3B in a printed wiring board according to a second embodiment.

A printed wiring board 20 according to a second embodiment will be described with reference to FIGS. 3A, 3B, and 4. FIG. 3A is a plan view schematically illustrating a metal core substrate 21 constituting the printed wiring board 20. FIG. 3B is a cross-sectional view taken along line C-C' in a range of D-D' in FIG. 3A. However, in order to facilitate understanding of the cross-sectional structure of an individual piece 210, protruding pieces and hole portions belonging to other individual pieces are omitted. Further, FIG. 4 is a cross-sectional view schematically illustrating a portion of the printed wiring board 20 corresponding to that in FIG. 3B. Note that, in the drawings, an X-axis, a Y-axis, and a Z-axis are defined similarly as in the first embodiment.

As illustrated in FIG. 4, the printed wiring board 20 includes the metal core substrate 21, an insulation layer 22, and a solder resist layer 23, 24, as in the printed wiring board 10 according to the first embodiment. The printed wiring board 20 is different from the printed wiring board 10 according to the first embodiment, mainly in protruding pieces 221 to 226 and 251 to 256 and hole portions 241 to 244 and 261 to 264. Accordingly, a description will be made hereinafter focusing on the metal core substrate 21.

The individual pieces 210 to 213 in the metal core substrate 21 each have a quadrangular shape, and only the predetermined number thereof are aligned in the X-axis direction and the Y-axis direction, as in those in the first embodiment. Since the plurality of individual pieces 210 to 213 has the same shape, the individual piece 210 will be described below.

Further, the protruding pieces 221 to 223 are provided along the planned cutting line CL21, while the protruding pieces 224 to 226 are provided along the planned cutting line CL22. Further, the protruding pieces 251 to 253 are provided along the planned cutting line CL25, while the protruding pieces 254 to 256 are provided along the planned cutting line CL24. Thus, the individual piece 210 surrounded by theses protruding pieces 221 to 226 and 251 to 256 has a substantially rectangular shape that is formed by the lines along the planned cutting lines CL21, CL22, CL24, and CL25.

Then, the protruding pieces 221 to 226 and 251 to 256 extend from the four sides of the individual piece 210, and connect the sides adjacent to each other of the individual pieces (211, 213, etc.) adjacent to the individual piece 210. The plurality of protruding pieces 221 to 226 and 251 to 156 may be provided, at predetermined intervals, to the four sides formed in the individual piece 210. Here, the predetermined intervals indicate a distance between the protruding pieces 221 to 226 and 251 to 256 adjacent each other (e.g., a distance between the protruding pieces 221 and 222), and corresponds to the length of the hole portions 241, 242 along the planned cutting line CL21. It is preferable that such a predetermined interval is, for example, equal to or greater than the thickness D20 of the protruding pieces 221 to 226 and 251 to 256. Note that, in the second embodiment, the thickness D20 of the protruding pieces 221 to 226 and 251 to 256 is equal to the thickness of the metal core substrate 21, but may be smaller than the thickness of the metal core substrate 21.

Then, the protruding pieces 221, 223, 224, 226, 251, 253, 254, and 256 (i.e., the protruding pieces closest (next) to corner portions 210a to 210d of the individual piece 210 in each of the sides) are provided, at positions at which an offset corresponding to the thickness D20 of the protruding pieces 221 to 226 (metal core substrate 21) is provided with respect to the corner portions 210a to 210d of the individual piece 210, that is, at positions distant by D21 to D24, respectively, from the corner portions 210a to 210d. For example, it is preferable that offsets D21 to D24 are provided to have a length of 210 µm in the metal core substrate 21 having a thickness of 210 µm, a length of 160 µm in the metal core substrate 21 having a thickness of 160 µm, or a length of 120 µm in the metal core substrate 21 having a thickness of 120 µm.

Further, the total length of the protruding pieces 221 to 226 and 251 to 156 along the side of the individual piece 210 (L21+L22+L23, L25+L26+L27) is equal to or greater than 50% of the lengths L20, L24 of the sides, as expressed by the following formulas 3 and 4.

$$L20 \le (L21+L22+L23) \times 2 \quad \text{(formula 3)}$$

$$L24 \le (L25+L26+L27) \times 2 \quad \text{(formula 4)}$$

The printed wiring board 20 having such a configuration is manufactured similarly to the printed wiring board 10 according to the first embodiment. However, since the half-etching method is not necessary to be used to form the protruding pieces 221 to 226 and 251 to 256, the manufacturing method is simplified.

Accordingly, in the second embodiment as well, even if a burr is formed by cutting of the protruding pieces 221 to 226 and 251 to 256, such a burr do not reach other protruding pieces. Thus, it is possible to suppress a burr from dropping. Further, since the protruding pieces 221 to 226 and 251 to 156 can be provided as close to the corner portions 210*a* to 210*d* as possible, it is possible to prevent damage caused by warpage during a process flow. Furthermore, since the protruding pieces 221 to 226 and 251 to 156 are able to have a greater width, it is easy to handle the printed wiring board 10 even if the metal core substrate 21 becomes thinner. Further, since the thin metal core substrate 21 can be used, it is possible to obtain the metal core substrate 21 having stiffness.

Third Embodiment

Figure 7:
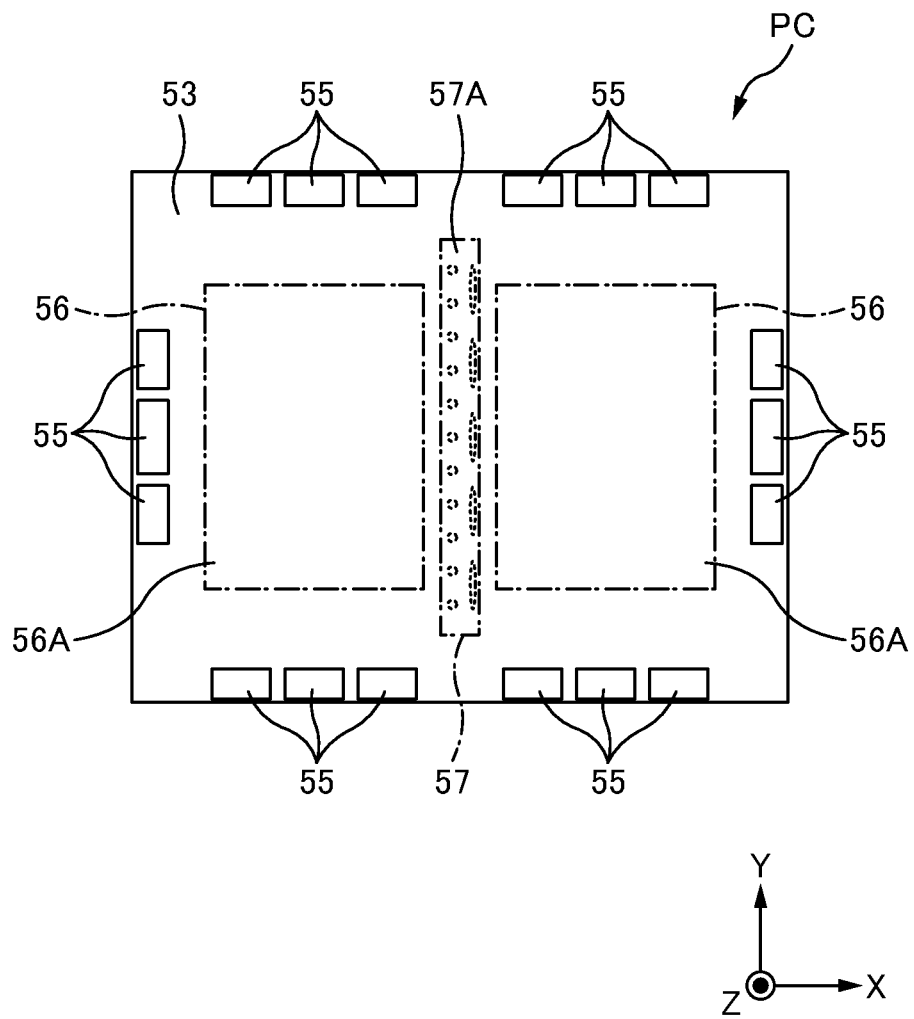
FIG. 7 is a plan view schematically illustrating a wiring density of a mounting region in a substrate according to a third embodiment.

A printed wiring board PC according to a third embodiment will be described with reference to FIGS. 7, 8, and 9A to 9C. FIG. 7 is plan view schematically illustrating a wiring density of a part of a mounting region in the printed wiring board PC according to a third modified example. FIG. 8 includes partial enlarged side views schematically illustrating the printed wiring board PC according to the third modified example. FIG. 9 illustrates an example relating to wiring density. Note that in FIGS. 7, 8, and 9A to 9C, an X-axis, a Y-axis, and a Z-axis are defined similarly as in the first embodiment. Further, the printed wiring board PC has a configuration similar to that of the printed wiring board 10 illustrated in FIG. 2. For example, the printed wiring board PC illustrated in FIG. 7 is a four-layer substrate configured such that two layers are provided on the front side and two layers are provided on the back side, with the metal core substrate serving as the core. FIG. 9B illustrates a conductive pattern P1 of a first layer that is provided to the metal core substrate 51 in FIG. 9C, and FIG. 9A illustrates a conductive pattern P2 of a second layer. A conductive pattern of the lower layer of the metal core substrate 51 is similarly formed of two-layer conductive patterns, although not shown in the drawings. Further, the conductive patterns on the front and back sides are electrically connected via a through-hole and/or a via.

Note that, hereinafter, a description will be made such that the metal core substrate 11, the insulation layer 12, the solder resist layer 13, 14 in FIG. 2 are applied to the metal core substrate 51, an insulation layer 52, solder resist layer 53, 54 in FIGS. 7, 8, and 9. Further, the conductive patterns P1, P2 are constituted by wiring or an electrode formed integrally with wiring. Thus, the conductive pattern P1 of an inner layer is covered with an insulation layer of an upper layer, and the conductive pattern P2 of an uppermost layer is covered with solder resist. Then, a part of the electrode is exposed from an opening portion of the solder resist.

As illustrated in FIG. 7, metal terminals 55 are disposed in the periphery of the printed wiring board PC, and are exposed from opening portions of the solder resist 53. Note that, in the metal terminals 55, wiring (not shown) covered with the solder resist layers 53, 54 is provided. As illustrated in FIGS. 7 to 9, the printed wiring board PC includes: the conductive patterns P1, P2, the metal terminals 55 which are included in the conductive patterns; a via; a through-hole; and the like, and components to contact the metal terminal 55 and other electrodes of the printed wiring board PC are mounted, so that a desired circuit is achieved. In FIG. 7, achieved is a camera module in which image pickup devices are mounted.

Subsequently, the printed wiring board PC includes a plurality of mounting regions. Rectangular portions indicated by chain lines on the left and right are the device mounting regions 56, and the component mounting region 57 is provided between these two device mounting regions. In the device mounting regions, image pickup devices (not shown) are provided so as to face upward, and the back surfaces of the image pickup devices are fixed onto the solder resist layers 53, 54 using an adhesive. Then, the metal terminals 55 are provided in the periphery of such mounting regions of the image pickup devices, and the image pickup devices and the metal terminals 55 are connected using bonding wires. The component mounting region 57 is a region in which, for example, a semiconductor element, a passive component, and the like, other than the image pickup devices, are mounted. For example, a chip resistor, a chip capacitor, an IC, and the like are fixed via solder.

Subsequently, stiffness of the printed wiring board PC will be described. It is mentioned here that stiffness is enhanced by devising conductive patterns 56A, 57A. In semiconductor chips which are two image pickup devices, the back surfaces thereof are fixed to the printed wiring board PC. Thus, by virtue of the stiffness of such a Si chip as well, the stiffness is maintained in a portion corresponding to this device mounting region 56 as a printed wiring board PC integrated with the chips. Then, if nothing is devised in the component mounting region 57 between the chips, which region is weak, and thus the printed wiring board PC may be warped from here. Since occurrence of such warpage complicates adjustments to the two image pickup devices, the component mounting region 57 also needs to enhance its stiffness. In an embodiment of the present disclosure, the densities of the conductive patterns 56A, 57A in the device mounting region 56 and the component mounting region 57 are considered. First, two image pickup devices synthesize two image data to achieve high resolution. Thus, conductive patterns (wiring and electrodes) for this signal processing are concentrated in a region between two ICs, that is, in the component mounting region 57. In addition, components are also concentrated and fixed thereto. On the other hand, in the device mounting region 56, the back surfaces of the chips are fixed to maintain stiffness, so that it is possible to place a conductive pattern having a density lower than a conductive pattern of the component mounting region 57. For example, if removal of a conductive pattern is needed in order to adjust impedance, such a place should be in the device mounting region 56.

That is, in the case where the conductive patterns 56A, 57A are formed in the inner layer of the printed wiring board PC, higher stiffness can be maintained by virtue of the provision of conductive patterns. Accordingly, the conductive patterns 57A are concentrated on the component mounting region 57 side, so that the density thereof is made higher than the densities of the device mounting regions 56. Furthermore, since components other than the image pickup devices are fixed via this conductive patterns 57A, solder, etc., it is possible to further increase stiffness. Further, by disposing such a conductive pattern 56A as to have a low density under the chips, a portion that may cause deterioration of stiffness is placed under the chips. That is, a portion in which a conductive pattern has a low density is provided in such a device mounting region 56, i.e., in a lower layer of a chip, so as to prevent deterioration of stiffness, while a portion in which a conductive pattern has a higher density is provided in the component mounting region 57, thereby enhancing synthesis of these portions. Accordingly, a module of the printed wiring board PC in which the image pickup devices and components are mounted, is enhanced in stiffness as a whole.

Figure 11A:
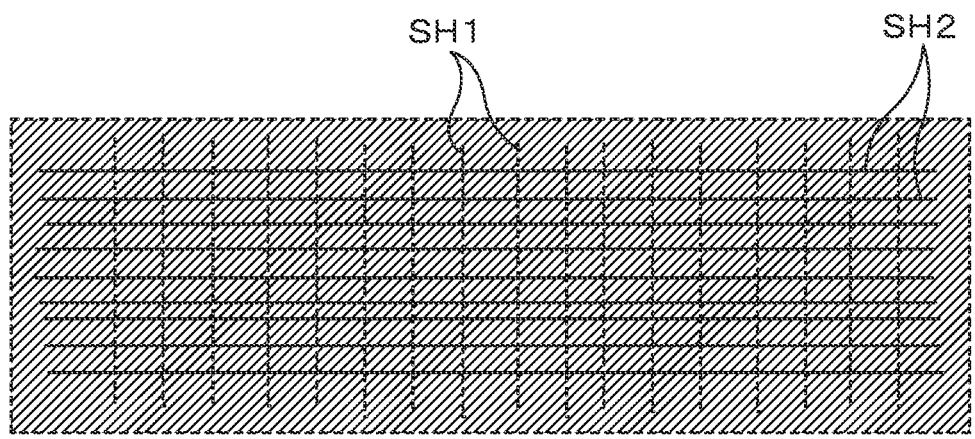
FIGS. 11A, 11B, and 11C illustrate an intimate contact configuration between a copper plating film and an insulation layer containing glass fibers.

Subsequently, the low and high densities of the conductive patterns 56A, 57A will be described with reference to FIG. 9. FIG. 9C illustrates the metal core substrate 51 which is located in the core of the printed wiring board PC and is described in FIG. 1B. Subsequently, on an upper layer thereof, at least the insulation layer 52 is covered, and the conductive pattern P1 of a first layer is provided thereto. Further, the conductive pattern P2 of a second layer is provided via the insulation layer 52. Note that two-layer conductive patterns are formed, similarly, on a lower layer of the metal core substrate 51, but they are omitted here. First, in the metal core substrate 51, through-holes and dummy through-holes are provided in a uniform manner to some extent, which will be described with reference to FIG. 11. The holes of such through-holes and dummy through-holes are filled with a resin of the insulation layer or other insulating resin materials, and thus, by disposing them in a uniform manner, the balance of the metal core substrate 51 as a whole is equalized, so that generation of unnecessary stress is minimized.

Subsequently, in FIG. 9A, wiring P2a is illustrated in the conductive pattern P2 of the second layer. This wiring P2a is, for example, a line of a differential circuit, and impedance variation, such as capacitive coupling, may occur between this differential line P2a and the conductive pattern P1 of the first layer in some cases. In particular, when the conductive pattern of the first layer indicated as GND is coated in the large area, the conductive pattern overlaps with the differential line P2a, and capacitance is coupled, and thus a removal region C may be provided. In an embodiment of the present disclosure, the removal region C is provided in the device mounting region 56, particularly, in the lower layer of the fixed chip, so that deterioration in stiffness, which occurs due to such removal, is prevented. Furthermore, as described above, wiring and electrodes which are conductive patterns are concentrated in the component mounting region 57, so that the mounting density of the conductive patterns therein is made higher than that in the device mounting region 56. In other words, the remaining-copper rate, which is a rate at which Cu patterns are provided in layers, is set to be higher in the component mounting region 57 than in the device mounting regions 56. Note that only at least one layer in the layers has to satisfy this remaining-copper rate.

The conductive patterns disposed on the back surface from the lower layer of the metal core substrate 51 are also similar thereto. As will be described later, by virtue of the stiffness of the metal core substrate 51 including a main component of a rolled Cu layer, the adhesion between the copper plating film layer and glass fiber sheet, the remaining-copper rate of conductive patterns being devised, it is possible to enhance stiffness of the printed wiring board PC, thereby being able to provide the printed wiring board PC that is thin, excellent in heat dissipation, and further does not break against impact.

First Modified Example

Figure 5:
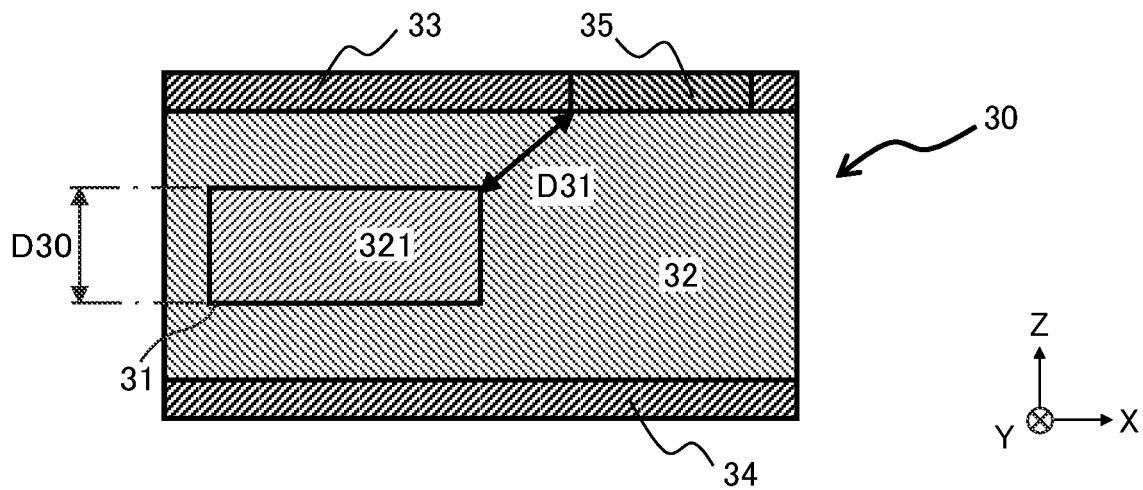
FIG. 5 is an enlarged cross-sectional view schematically illustrating a printed wiring board according to a first modified example.

A printed wiring board 30 in a first modified example will be described with reference to FIG. 5. FIG. 5 is an enlarged cross-sectional view schematically illustrating the printed wiring board 30. The printed wiring board 30 includes a metal core substrate 31, an insulation layer (omitted in the drawings), a solder resist layer 33, 34, a conductive pattern 35, as in the printed wiring board 20 according to the second embodiment. Note that an electrode exposed on the solder resist layer 33, 34, i.e., the conductive pattern 35 in this example, is schematically illustrated as the metal terminal 35.

The metal terminal 35 is exposed on an opening portion of the solder resist layer 33, and is provided at a position distant, by a distance D31, from the protruding piece 321 of the metal core substrate 31. Here, the distance D31 is equal to or greater than the thickness D30 of the protruding piece 321. Accordingly, it is possible to prevent the metal terminal 35 exposed on the surface of the solder resist layer 33 and a burr generated from the metal core substrate 31 from coming into contact with each other and being short-circuited.

Second Modified Example

Figure 6:
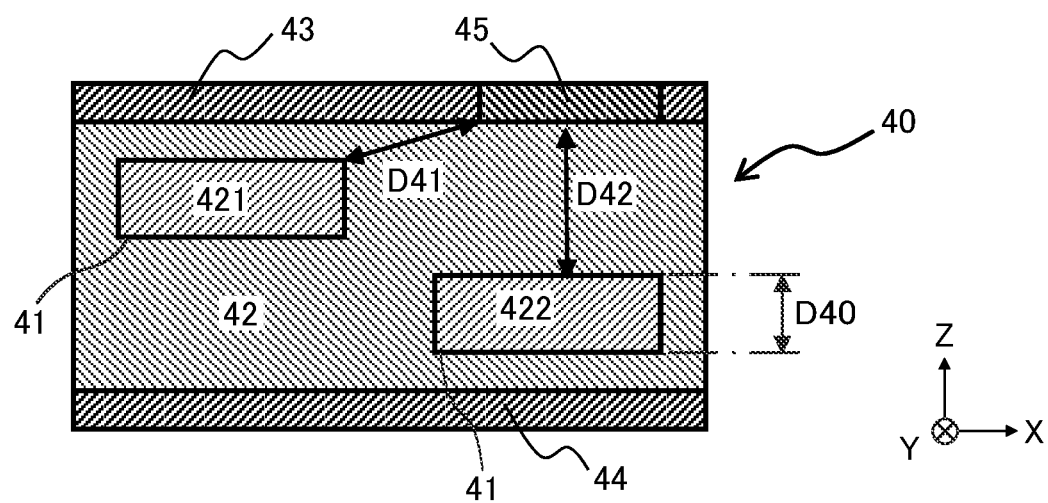
FIG. 6 is an enlarged cross-sectional view schematically illustrating a printed wiring board according to a second modified example.

A printed wiring board 40 according to a second modified example will be described with reference to FIG. 6. FIG. 6 is an enlarged cross-sectional view schematically illustrating the printed wiring board 40. The printed wiring board 40 includes a metal core substrate 41, an insulation layer 42, a solder resist layer 43, 44, a conductive pattern 45 (metal terminal 45), as in the printed wiring board 10 according to the first embodiment. Note that the metal terminal 45 is exposed on an opening portion of the solder resist layer 43, 44.

The metal terminal 45 is exposed on the opening portion of the solder resist layer 43, and is provided distant, by distances D41, D42, from protruding pieces 421, 422 of the metal core substrate 41, respectively. Here, the distances D41, D42 are equal to or greater than a thickness D40 of the protruding pieces 421, 422. Accordingly, it is possible to prevent the metal terminal 46 exposed on the surface of the solder resist layer 44 and a burr produced from the metal core substrate 41 from coming into contact with each other and being short-circuited.

Third Modified Example

The prevention of solder shorts between protruding pieces (bridges) BG1 to BG4 and conductive patterns P will be described with reference to FIG. 8A. FIG. 8 partially illustrates the printed wiring board PC. The insulation layers IN are provided on both sides of a metal core substrate MC and conductive patterns are provided thereto. On the front surface, as described in FIGS. 7 and 9, conductive patterns (electrode P11 and wiring P12) to electrically connect image pickup devices and other components are provided, while on the back surface (not shown), for example, a solder ball electrode, rewiring of this electrode, and the like are provided. Note that a description will be made using a two-layer printed wiring board PC in this example, but a printed wiring board including two layers or more can be applied. Further, on a side surface thereof, the cross-sectional surfaces of the protruding pieces (bridges) BG1 to BG4 cut along the dicing line in FIG. 1A are exposed. Since these protruding pieces BG1 to BG4 are made of the same material as in the metal core substrate MC, the material is Cu. Further, the protruding pieces BG1 to BG4 are provided on the front and back surfaces in an alternate manner, as illustrated in FIG. 1B, which are illustrated as the protruding pieces BG1 to BG4. Originally, if there is no solder short problem, BG1, BG2, BG3 indicated by a dotted line, and BG4 are obtained.

Figure 8A:
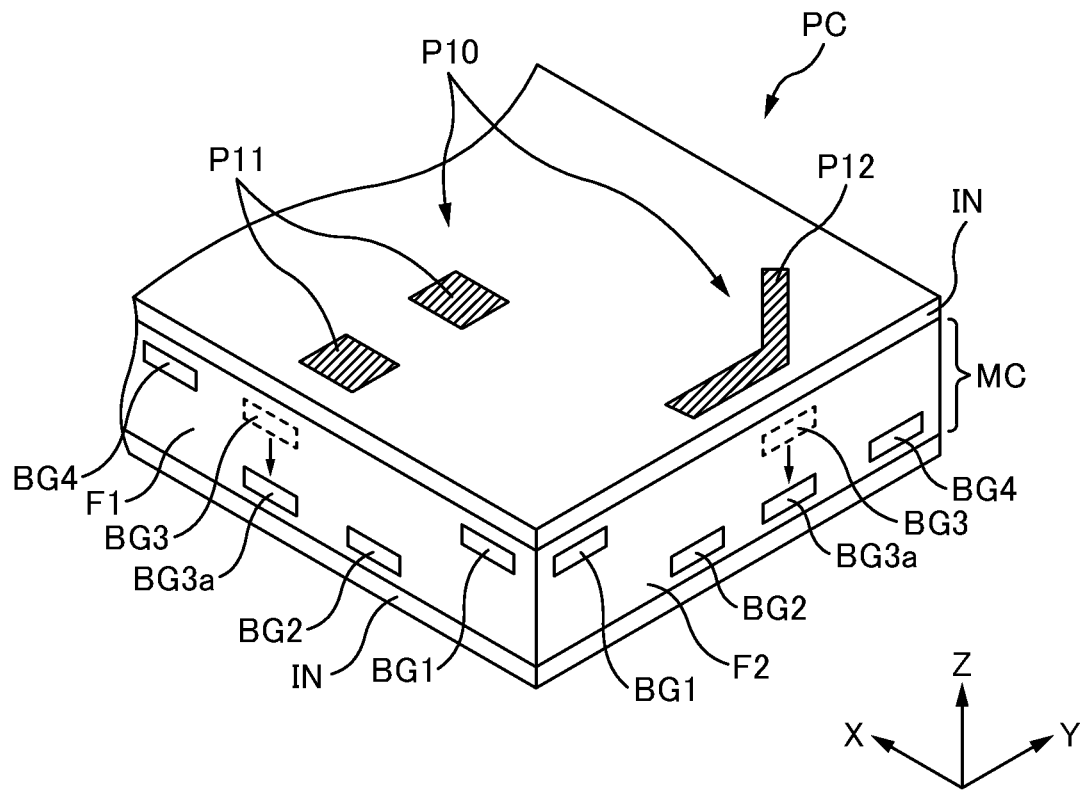
FIGS. 8A and 8B are partial enlarged side views schematically illustrating a printed wiring board according to a third modified example.
Figure 9A:
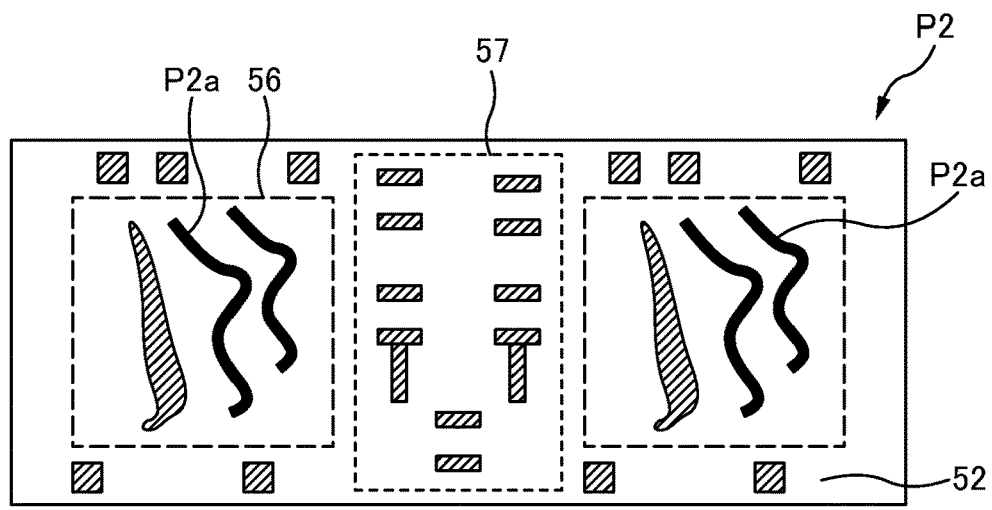
FIGS. 9A, 9B, and 9C illustrate an example of wiring density.
Figure 9B:
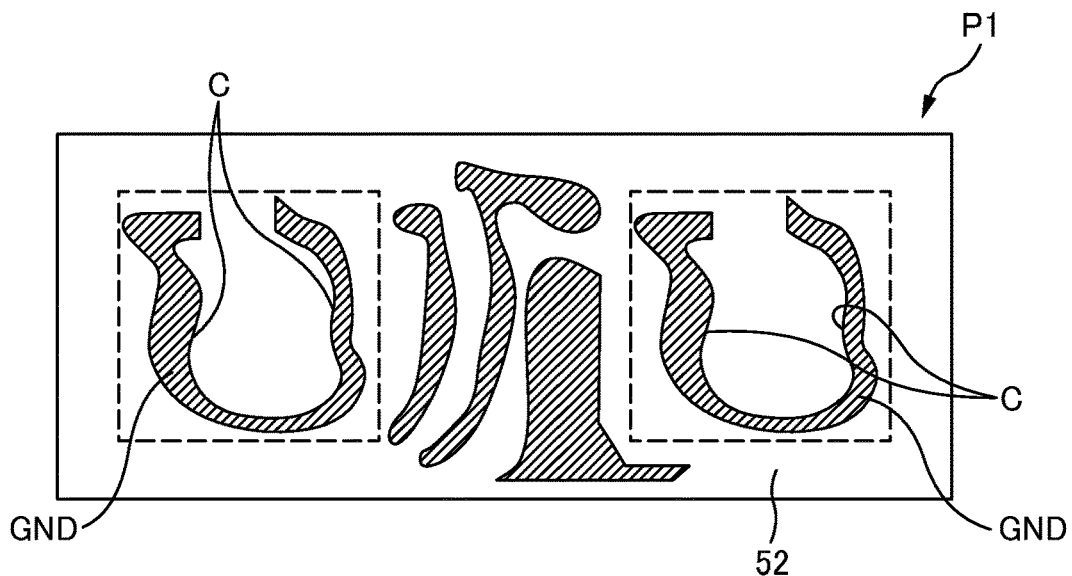
Figure 9C:
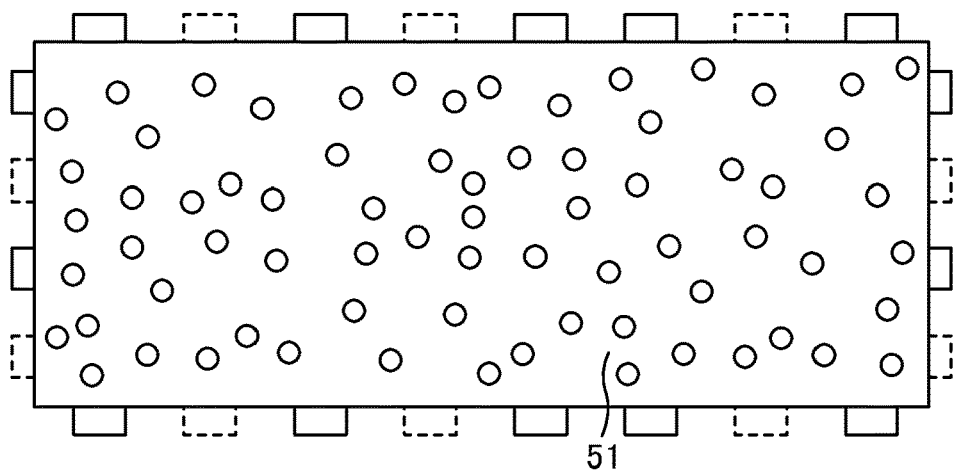

FIG. 8A illustrates conductive patterns given on the front surface of the printed wiring board PC, that is, in this example, the electrodes P11 on the left side and the wiring P12 on the right side are illustrated as conductive patterns other than GND. These conductive patterns may be disposed in the vicinity of the printed wiring board PC. Specifically, in a side surface F1 close to the electrode P11, when the protruding piece BG3 is provided at a portion corresponding to the X coordinate of the electrode, solder provided to the electrode P11 might overflows from the electrode P11 to the protruding piece BG3, which may result in a short. Particularly, the metal core substrate MC is grounded to GND, and thus, for example, an electrode and/or wiring applied with a signal other than GND results in a short, which may cause failure. Accordingly, in an example according to the present disclosure, the protruding piece BG3 is avoided (moved) from BG3 to BG3a in a design stage, as indicated by arrows, to prevent solder shorts.

There is also another case of preferably avoiding the wiring P12, similarly. That is, there may be a case where, when mounting a component, solder is erroneously provided on the wiring P12 and this solder flows over to a side surface F2. Accordingly, when the protruding piece BG3 is positioned at a portion corresponding to the Y coordinate of the wiring P12 in the side surface F2, the position thereof is changed from BG3 to BG3a beforehand in the design stage, so as to increase a distance from the wiring P12, thereby being able to prevent solder shorts. Further, the protruding piece BG3 may be omitted without being moved to BGa3. In this case, no protruding piece is provided between BG1 and BG4 that are positioned on the front surface side, and instead the insulation layer is exposed. Further, in the case where there is a long wiring, a large-scale electrode, or the like, at least one or more of the protruding pieces BG2, BG3 may be omitted between BG1 and BG4.

Figure 8B:
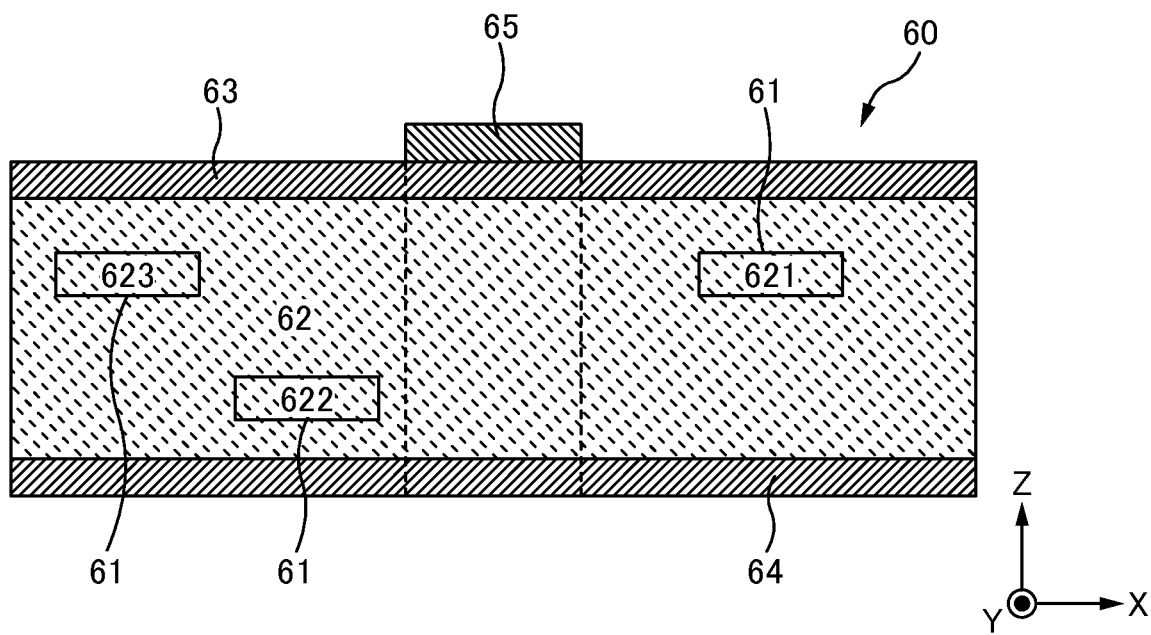

FIG. 8B illustrates the end surfaces of protruding pieces 621 to 623 exposed on a side surface of a the printed wiring board 60, and a metal terminal 65 disposed close to the coordinates of these protruding pieces. The protruding pieces 621 to 623 are disposed, for example, so as not to overlap with the metal terminal 65 in the thickness direction of the printed wiring board 60. As a result, even if solder overflows and lies onto the side surface of the printed wiring board 60, it will not contact the protruding pieces 621 to 623. Further, the metal terminal 65 and the protruding pieces 621 to 623 may be disposed so as to partially overlap with each other in the thickness direction of the printed wiring board 60 to the degree of about a design error. That is, the protruding pieces 621 to 623 only have to be formed in a direction of avoiding the metal terminal 65 in the X-direction. Note that an avoidance distance of the protruding pieces 621 to 623 is set so as to be distant by the thickness of the protruding pieces 621 to 623 or more.

Fourth Embodiment

Hereinafter, enhancement in stiffness of a printed board will be described. Here, when the meaning of stiffness is explained as "a property of resisting deformation when an object is applied with a force to deform it." In another expression, stiffness means the degree of difficulty in dimensional change (deformation) against a bending force or twisting force, and from this viewpoint, high stiffness indicates that the excellent ability to maintain flatness of a flat substrate.

In an embodiment of the present disclosure, stiffness indicates the ability that the metal core substrate MC or the printed wiring board PC including the metal core substrate MC maintains flatness thereof. That is, it means the ability to have some degree of hardness as well as maintain flatness against various forces such as external force, stress, and heat. For example, in a two-lens camera module or the like, employment of a substrate having such flatness has such a merit that optical adjustments to both image pickup devices can be easily made. Thus, due to the trend toward lighter and more compact size, a thin printed wiring board that has stiffness and is resistant to fracture is to be employed.

Subsequently, considering the materials of a printed wiring board, the main material has three types: a resin substrate, an inorganic ceramic substrate made of glass or alumina, and a metal substrate made of copper or aluminum. However, a resin substrate is mechanically weak and further is less resistant to temperature and is deformable. Further, although having flatness and hardness, the ceramic substrate, when becoming thinner, increases this fragility so that it breaks immediately with an impact being applied thereto. Further, metal has a large thermal expansion rate, and may cause warpage. Thus, a printed wiring board capable of overcoming these drawbacks and maintaining stiffness is desired. Further, also in a large-scale printed wiring board employing such a configuration (also referred to as an assembly substrate), effects can be exerted on workability in manufacturing by virtue of minimization in warpage. The present disclosure employs a metal core substrate configured such that a main substrate made of rolled copper having a high elastic modulus is copper-plated on both sides thereof, thereby being able to obtain its stiffness, and thus a description thereof will be made below.

First, a construction of copper employed as the metal core substrate will be described. Cu foil is mainly divided into two types: one is rolled copper foil, and the other is Cu foil by plating (hereinafter, referred to as the copper plating film). The former rolled copper foil is thinly rolled in a gradual manner by a rolling process, to be finished to have a predetermined thickness in the end, and the crystal thereof is, different from a copper plating film, and is largely expanded in a surface direction. As a result, rolled copper foil has the main characteristics of high flexibility and great surface roughness. Further, since the rolled copper foil is compressed with a large pressure, stiffness/hardness thereof is more excellent than in the copper plating film. The latter copper plating film includes: Cu plating used when forming a conductive pattern such as a printed board; and electrodeposited copper foil wound on a drum. This electrodeposited copper foil is obtained by using a cylindrical metal drum cathode, performing electroplating up to the target thickness while rolling the drum, and continuously winding it thereon. Further, Cu plating employed for the printed board is formed into a printed board in an electroless or electrolytic manner by immersing it into plating solution. In both cases, the crystal structure thereof is smaller than that of the rolled copper foil, has a polycrystalline structure, and exhibit tubular structure by growing in the thickness direction. Thus, when the wiring board is bent, cracks are likely to be generated along the grain boundary of tubular crystal structure, and tend to be broken in a relatively early stage.

Further, considering adhesion of resin, since the rolled copper foil has a small surface roughness as described above, the adhesion thereof is smaller than that of the copper plating film. In contrast, the copper plating film has a polycrystalline structure growing in the thickness direction, and thus has a fine rough surface and higher adhesion as compared with that of the rolled copper. FIG. 10B schematically illustrates these characteristics. The reference character of the rolled Cu layer is given as RC (Rolled Copper), while the copper plating layer is given as CP (Copper Plating). Further, since this copper plating layer CP has a polycrystalline structure, the roughness thereof can be made more noticeable by etching. This is because, generally, considering the etching rate of grains and grain boundaries, the etching rate of grain boundaries is higher.

In an embodiment of the present disclosure, the following construction is focused so as to employ both advantages. That is, the rolled Cu layer RC is employed as the main metal core substrate MC, and the plating layers CP are formed on both sides of this rolled Cu layer MC. The merits of this structure will be described below. Note that the plating layer CP may be copper, silver, platinum, gold, Ni, Cr, or the like, but copper is employed here.

Firstly, increase in stiffness of the large-scale metal core substrate MC or large-scale printed wiring board PC, and increase in stiffness of the metal core substrate of the individual piece or printed wiring board PC of the individual piece will be described as follows. The plating layer CP having a thickness A of about 10 μm and the rolled Cu layer RC having a thickness B of 50 μm to 320 μm are employed. As such, increase in the thickness of the rolled Cu layer RC itself can ensure hardness and stiffness. For example, the thicknesses are expressed as $2A:B \approx (1:16)-(2:5)$ in a range of $2A<<B$. Note that the thickness of the plating layer CP is set to 10 μm, but specifically, it is about 6 μm to 10 μm. A process of a contact hole (via) after forming the insulation layer IN and a process of roughening the plating layer CP, so as to come in intimate contact with an insulation layer IN, include a process of etching the plating layer CP, such as a desmear process and light etching. It is found out that, if the plating layer CP does not have a thickness in the aforementioned range, the plating layer CP disappears when forming an electrode in the contact hole. The portion covered with the insulation layer IN other than contacts C2 to C4 in FIG. 10 has a thickness in a range of about 6 μm to about 10 μm, since only a surface roughening process is performed thereto.

Secondly, increase in adhesion between the copper plating layer CP and the rolled Cu layer RC and adhesion between the copper plating layer CP and an insulation layer IN1 will be described below. The material of the copper plating layer CP is copper which is the same material of the rolled Cu layer RC, and the adhesion therebetween is excellent. Further, since the copper plating layer CP itself is polycrystalline, the surface thereof has fine irregularities. When etching is further performed, the boundaries around the grains are removed, and the irregularities become further remarkable, that is, which resulting in a rough surface. These irregularities bring out anchor effects, which leads to the excellent adhesion with the resin of the insulation layer IN1. FIG. 10B schematically illustrates such characteristics. The portions depicted by triangles are polycrystalline plating layers. As described above, these polycrystalline layers are laminated into multiple layers, the surface polycrystalline layer is etched so that the irregularities appear. Note that the degree of roughness is high in the portion intimately contacting the insulation layer other than contacts, while the degree of roughness is low and gentle in the contacts C3, C4.

Thirdly, further increase in stiffness by using a filler together will be described below. The filler is in various forms such as granular form, crushed form, short fiber form (needle-like), and woven fiber sheet form. In any form, since the filler has a greater hardness than that of a resin, the stiffness increases when the filler is mixed into a resin. The fillers in granular form, crushed form, or short fiber form include a silicon oxide film, aluminum oxide, needle-like glass fibers, and needle-like carbon/graphite fibers. They have short lengths or are small grains and move independently, as compared with a fiber sheet. Thus, even if they are hardened with resin, the planar strength and flatness are smaller than those of fiber sheet which will be described below. On the other hand, a sheet SH is a reinforcing sheet formed by weaving reinforced fibers such as carbon fibers, glass fibers or the like. Here, glass cloth is employed. FIG. 11 schematically illustrates this. The characteristics thereof are that it is woven two-dimensionally (sheet-like manner), that is, woven thinly like cloth. The sheet SH is formed such that a large number of lateral strings SH1 and lengthwise string SH2 are aligned and woven in such a manner as to be sewn with a needle and strings, as one example. When considering, for example, a handkerchief, this single handkerchief itself can be softly warped and is deformable in its left, right, upper, and lower parts, however, it is integrally formed by being woven, and when an adhesive or the like is applied to this handkerchief and hardened, its stiffness is enhanced and also is not likely to fall apart. Furthermore, since fibers are woven like cloth, warpage and deformation upward, downward, leftward or rightward can be prevented. This is further improved if the material is glass or carbon.

Figure 11B:
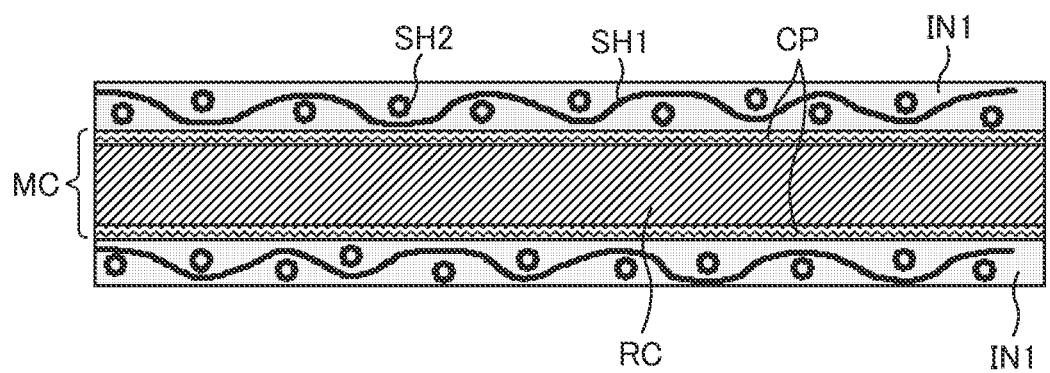

Further, as illustrated in FIG. 11B, the sheet-shaped insulation layers IN1 are placed onto both surfaces of the metal core substrate MC. The resin of such an insulation layer IN1 is in intimate contact with the irregularities of the copper plating layer CP, and further, sheet-shaped reinforcing fibers (reinforcing filler) are placed onto the entire surface of the metal core substrate MC and integrated. That is, the reinforcing sheet SH is inserted, and the insulation layer IN hardened with a resin is in intimate contact with the copper plating layer CP by virtue of anchor effects while maintaining its plain surface shape. Thus, stiffness/flatness as the printed wiring board PC further increases. Note that, when a description is made with reference to FIGS. 11A and 3A, the insulation layer IN provided with the sheet SH is provided up to the outside of a region surrounded by outer dicing lines CL11, CL13, CL14, and CL16, and thus is provided to the protruding pieces, after singulation. Note that, in a multilayer wiring substrate including a plurality of layers on both front and back sides, this reinforcing filler may be used for all the laminated insulation layers. For example, glass cloth and granular filler are used for reinforcement. Further, since it is a double-sided board, it is necessary that at least one layer of an insulation layer is provided on the front and back sides and the metal core substrate is sandwiched between the reinforcing fillers. Further, since it is cloth, cloth-like reinforcing member is not inserted between the protruding pieces. Thus, when viewed as a single printed wiring substrate, only resin is provided between the protruding pieces opposed to each other in the side surfaces in a place from the individual piece to the ends of the protruding pieces. Since this portion is made of resin and the protruding pieces are made of metal, mismatch is caused by difference in thermal expansion coefficient. In an embodiment of the present disclosure, a filler in granular form, crushed form, or short fiber form is provided, together with cloth, in the resin of the insulation layer IN1 as a reinforcing material. Thus, such mismatch can be greatly reduced. Note that the cloth and the filler in granular form, crushed form, or short fiber form are preferably made of the same material.

Figure 11C:
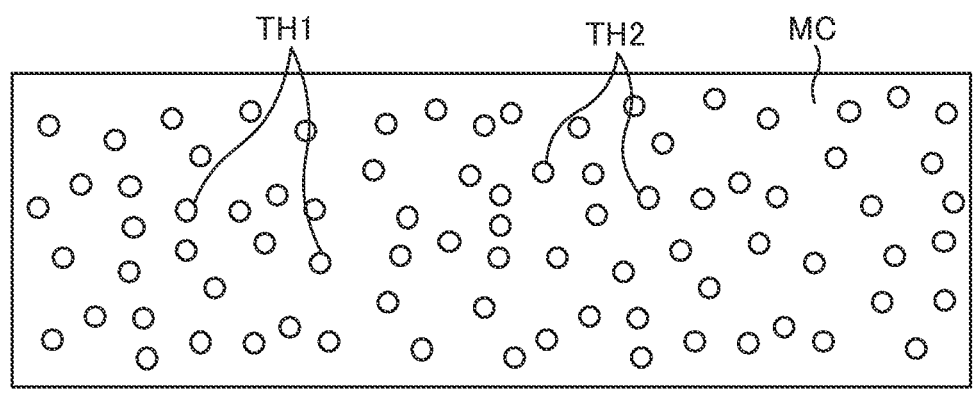

Fourth, the metal core substrate MC will be described below. FIG. 11C illustrates a pattern of the metal core substrate MC. Provision of a large hole in the metal core substrate MC reduces strength. That is, in order to enhance stiffness of the metal core substrate MC, it is better to avoid provision of a large hole therein. For example, it is preferable not to form a cavity for incorporating an IC or a chip capacitor. In specific, it is preferable to avoid formation of a cavity incorporating an IC chip considering the size thereof. However, in the printed wiring board PC, a large number of through-holes TH1 are formed to connect a conductive pattern on the front side and a conductive pattern on the back side. If these through-holes TH1 are non-uniformly formed, the balance is lost to cause warpage. Thus, the through-holes TH are dispersed substantially uniformly in the entire area of the individual piece so that the balance is maintained. In order to maintain the balance, dummy through-holes TH2 are provided. FIG. 11C schematically illustrates this. It is a matter of course that, after the positions of the necessary through-holes are determined, dummy through-holes are disposed considering the balance. Note that the diameter of these through-holes TH is about 300 μm to 500 μm. As such, cavities for incorporating components are eliminated, and the dummy through-holes TH2 are formed when forming the through-holes TH1, so that the through-holes are dispersed as a whole, which can resolve the unbalance in the metal core substrate or printed circuit board. This can suppress deformation such as warpage of the metal core substrate or printed circuit board. Note that the resin of the insulation layer IN is filled in the through-holes TH. The insulation layer IN is integrated with the resin layers on both sides of the metal core substrate MC of these through-holes. This can prevent the insulation layers from peeling.

It is also found out that the elimination of the dummy through-holes further enhances the stiffness. This is because a sheet obtained by weaving synthetic fibers, such as glass fibers, exists in the insulation layer and this insulation layer is in intimate contact with the plating layer by virtue of the anchor effects. With such a structure, it is found out that the thorough-holes including dummy through-holes are not necessarily provided in a uniform manner. In specific, the total area of the through-holes is set to 30% to 5% relative to the area of the individual piece. Accordingly, the area other than the through-holes results in about 70% to 95%. This indicates more than a half in the individual piece is metal without holes, so that stiffness is greatly increased.

Fifth, contact with the metal core substrate through a Via will be described below. FIG. 10A illustrates the structure of the printed wiring board PC, and FIG. 10B schematically illustrates three types of the structure of an encircled portion C1 in FIG. 10A. The copper plating film CP has a polycrystalline structure, and has a tubular structure in the thickness direction, and this structure is schematically illustrated by triangles in FIG. 10B. Note that, in actuality, fine crystals of various sizes are disposed vertically and laterally at random and laminated, as if a plurality of layers is laminated. The copper plating film CP of these fine crystals is roughened and an oxide film is further formed on the surface thereof, by processes which will be described below. This manufacturing method will be reviewed. First, the metal core substrate MC is prepared with a rolled Cu (RC), and then plated to form the copper plating films CP on both sides thereof. Further, the copper plating films CP are subjected to surface roughening treatment by CZ treatment or etching, to come in intimate contact with the insulation layer IN. Then, the through-holes TH1 and dummy holes TH2 are formed by etching. Note that the copper plating film CP including holes may be formed after through-holes are formed. Subsequently, at least one layer of a conductive pattern P insulated with the insulation layer IN is formed each on the front and back sides of the metal core substrate MC. For example, a contact hole (Via) V is provided in the first insulation layer IN1, and the copper plating film CP is exposed on its bottom portion. In this hole, an electrode P1 is formed by plating. In such processes, to perform hole formation and a curing process in the insulation layer IN1, a hole is processed by etching and/or laser, and the hole is immersed in an etching solution. When such processes are undergone, the copper plating film CP inevitably has an oxide film formed therein, and has ions, water, etc., trapped in grain boundaries. Thus, when the electrode P1 is plated in such a state, characteristics are affected, for example, such that a resistance value fluctuates due to increase in resistance value, ion migration, and the like.

Here, in order to solve such an issue, FIG. 10B illustrates solutions. A contact C2 has a structure involving this issue, and illustrates a state in which a contact hole is not processed at all. A contact C3 represents such a first solution that the copper plating film CP is removed via a contact hole V1 to expose a rolled Cu layer. Then, in the bottom portion of the contact hole, a large crystal structure that is flat and spread in a surface direction without an oxide film is exposed. Thus, ions and water are not easily trapped, so that preferable contact can be achieved. It is important to completely expose the rolled Cu layer by overetching. In a contact C4, a surface layer of the copper plating film CP is removed via a contact hole V1 to expose a flattened copper plating film. Then, in the bottom portion of the contact hole, an oxide film is removed and further a plating layer that is flattened to some extent from a rough surface is exposed, and thus ions and water are not easily trapped, so that preferable contact can be achieved.

Subsequently, FIG. 10C will be described. If all the metal core substrate is formed by plating and this metal core substrate is etched, variations in etching depth occur. This also applies to the copper plating film CP, and variations in etching depth and size occur, similarly, and thus, a core portion is constituted by a rolled Cu layer and a very thin copper plating film is formed on the surface thereof. As a result, etching variations of the copper plating film portion are reduced. Further, since ions, gases, and the like are blocked by the rolled Cu layer, a highly reliable printed wiring board can be achieved.

Sixth, the shapes of protruding pieces will be described below.

In FIG. 1A, those connecting the individual pieces 110, 111, 112, 113 are so-called protruding pieces 121 to 124 (hereinafter, referred to as "bridges 121 to 124"). The center of these bridges 121 to 124 serves as a dicing line, and after singulation, these bridges result in forming protruding pieces around the individual pieces. For example, when focusing on the bridges 121, 122, 123, 124, they are cut by a dicing blade cuts along the dicing line CL11. Then, due to the viscosity of copper, a whisker having a length of up to about the thickness of the bridges 121 to 124 tend to be produced. Thus, when the tip of the whisker hit on something, they will drop as a burr. Accordingly, it is preferable to dispose bridges at intervals greater than the thickness of the bridges 121 to 124 as much as possible. Further, the burr produced at the bridge 121 may hit on a corner portion of the individual piece. That is, it is also preferable to dispose the bridge 121 inside, by the thickness of the bridge 121, from the corner portion of the individual piece.

Figure 12A:
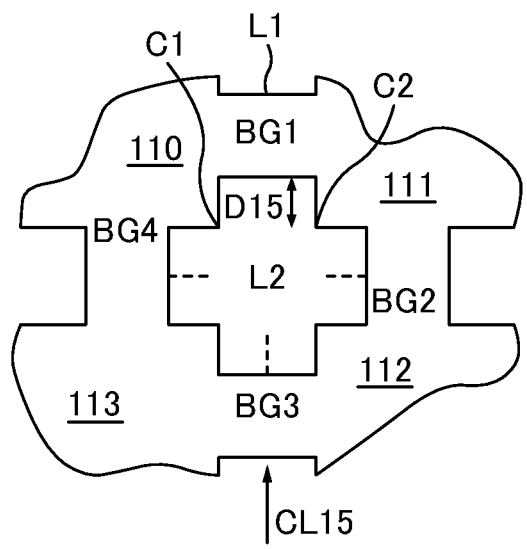
FIGS. 12A, 12B, 12C, and 12D illustrate protruding pieces of a cross-shaped slit portion.
Figure 12B:
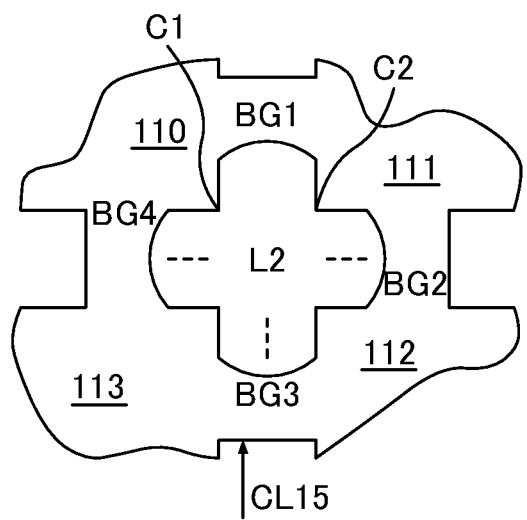
Figure 12C:
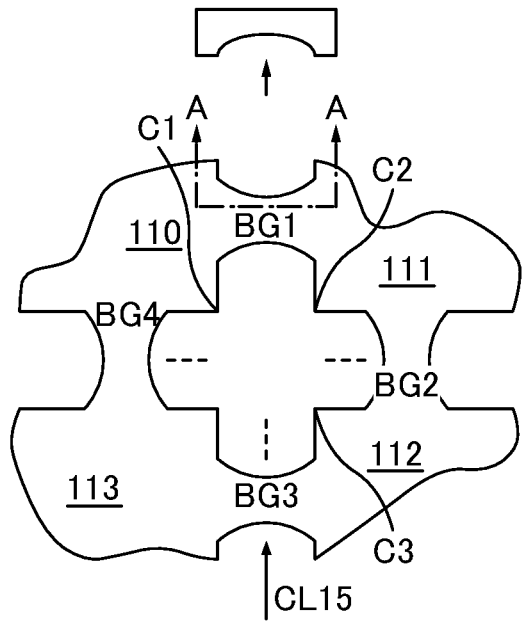
Figure 12D:
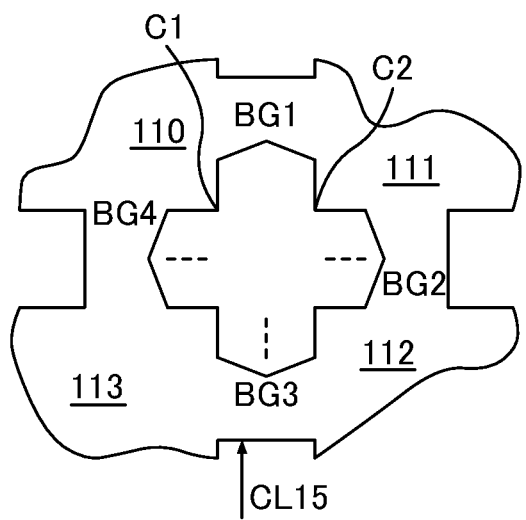

FIGS. 12A to 12D illustrate a cross-shaped slit at the center of FIG. 1A. FIGS. 12A to 12D illustrate the bridges BG1 to BG4 formed at the central portion of the individual pieces 110, 111, 112, and 113. Thin dashed lines are virtual lines depicted as burrs. FIG. 12A is an example in which lines L1, L2 of the bridge BG1 are straight. As illustrated in FIG. 1A, the bridge BG1 is provided at a position distant, by the offset D15 corresponding to the thickness of the bridges, from corner portions C1, C2. FIGS. 12B to 12D illustrate the bridges each in which a side L2 recessed in a direction opposite to the corner portions C1, C2, so as to further prevent such burrs from contacting the corner portions. For example, in FIG. 12B, the first bridge BG1 adjacent to the corner portions is provided between the individual pieces 110 and 111. Then, the side L2 draws a parabola formed into a recessed part that is recessed in a direction opposite to the corner portions. Further, in the individual pieces 111 and 112, the bridge BG2 is provided in the vertical direction so as to draw a parabola in a direction opposite to a corner C3. Accordingly, the four bridges BG1 to BG4 are formed so as to draw a circular shape. The four bridges BG1 to BG4 have roundness at the corners by etching, so that the cross-shaped slit appears to be of a circular shape. Note that the line L1 is also recessed toward the corner C1. Further, in FIG. 12C, the line L1 is straight.

Subsequently, FIG. 12D is a modified example of FIGS. 12B, 12C, and at least the line L2 is not a parabola, but in such a shape obtained by bending a straight line at the center thereof so as to have an angle. Accordingly, the bridges BG1 to BG4 are formed so as to draw a rhombus. In either case, since the dicing line CL15 corresponds to the most recessed place in the bridge BG1, a burr tends to be produced here. That is, the tip of such a burr is positioned on the further rear side of the offset D15. Thus, the burr can be further suppressed from falling. At this time, if the corner portions of the individual piece are rounded, it is also suppressed to be caught on the corner portions in the working process. Accordingly, it is possible to prevent burrs from falling upon impact in the working process.

[Summary]

As described above, the large-scale printed wiring board 10 (20) comprises: a metal core substrate 11 (21) including a plurality of metal individual pieces 110-113 (120-213) each having a front surface and a back surface having a shape of a rectangle, and four side surfaces connecting peripheries of the front surface and the back surface, the individual pieces being arranged in a first direction and a second direction orthogonal to the first direction, and a plurality of protruding pieces 121-128, 151-156 (221-226, 251-256) made of a same material as a material of the individual pieces 110-113 (120-213) and provided integrally therewith, the protruding pieces avoiding corner portions of the rectangle and connecting side surfaces of individual pieces adjacent to each other in the individual pieces; an insulation layer 12 (22) containing a reinforcing filler, the insulation layer being provided each on a front surface and a back surface of the metal core substrate 11 (21); and a conductive pattern provided to a surface of the insulation layer 12 (22), a total length of the protruding pieces along a side of the individual pieces in the protruding pieces 121-128, 151-156 (221-226, 251-256) being equal to or greater than 50% of a length of the side. According to an embodiment of the present disclosure, even if the protruding pieces 121-128, 151-156 (221-226, 251-256) become longer by cutting, the protruding pieces 121-128, 151-156 (221-226, 251-256) do not come in contact with each other. Thus, it is possible to minimize falling of burrs. Further, it becomes possible that the protruding pieces 121-128, 151-156 (221-226, 251-256) have a long width. Thus, even if the metal core substrate 11 (21) becomes thinner, it can be handled. Accordingly, in the case of a large-scale one, since the printed wiring board 10 is not caught on something or warped due to the protruding pieces 121-128, 151-156 (221-226, 251-256), workability when manufacturing the printed wiring board 10 is enhanced. Further, since a core thereof is formed using a metal member, it is not broken, for example, as in the case of a ceramic core when being mounted to a case.

Further, the printed wiring board 30 (40) comprises: a metal core substrate 31 (41) including a plurality of metal individual pieces 310-313 (410-413) each constituted by a front surface and a back surface having a shape of a rectangle and four side surfaces connecting peripheries of the front surface and the back surface, the individual pieces being arranged in a first direction and a second direction orthogonal to the first direction, and a plurality of protruding pieces made of a same material as a material of the individual pieces 310-313 (410-413) and provided integrally therewith, the protruding pieces avoiding corner portions of the rectangle and connecting side surfaces of individual pieces adjacent to each other in the individual pieces; an insulation layer containing a reinforcing filler, the insulation layer 32 (42) being provided each on a front surface and a back surface of the metal core substrate; and a conductive pattern provided to a surface of the insulation layer 32 (42), an offset between a first protruding piece 321-28, 351-356 (421-428, 451-456) adjacent to a corner portion of the rectangle and the corner portion being equal to or greater than a thickness of the protruding pieces, the first protruding piece 321-328, 351-356 (421-428, 451-456) being included in the protruding pieces, the corner portion being included in the corner portions. According to an embodiment of the present disclosure, it is prevented that a burr produced by cutting the protruding pieces 321-328, 351-356 (421-428, 451-456) contacts the metal terminal 35 (45) and causes a short circuit.

Further, the printed wiring board 30 (40) comprises: a metal core substrate 31 (41) including a metal individual piece 310-313 (410-413) constituted by a front surface and a back surface having a shape of a rectangle and four side surfaces connecting peripheries of the front surface and the back surface, a plurality of protruding pieces 321-328, 351-356 (421-428, 451-456) made of a same material as a material of the individual piece 310-313 (410-413) and provided integrally therewith, the protruding piece avoiding corner portions of the rectangle, and protruding from the side surfaces of the individual piece 310-313 (410-413); an insulation layer 32 (42) containing a reinforcing filler, the insulation layer being provided each on a front surface and a back surface of the metal core substrate 31 (41); and a conductive pattern provided on a surface of the insulation layer 32 (42), an offset between a first protruding piece 321-328, 351-356 (421-428, 451-456) adjacent to a corner portion of the rectangle and the corner portion being equal to at least a thickness of the protruding piece 321-328, 351-356 (421-428, 451-456), the first protruding piece being included in the protruding pieces, the corner portion being included in the corner portions. According to an embodiment of the present disclosure, it is prevented that a burr produced by cutting the protruding pieces 321-328, 351-356 (421-428, 451-456) contacts the metal terminal 35 (45) and causes a short circuit.

Further, the printed wiring board 30 (40) comprises:

a metal core substrate 31 (41) including a metal individual piece 310-313 (410-413) constituted by a front surface and aback surface having a shape of a rectangle, and four side surfaces connecting peripheries of the front surface and the back surface, a plurality of protruding pieces 321-328,351-356 (421-428, 451-456) made of a same material as a material of the individual piece 310-313 (410-413) and provided integrally therewith, the protruding piece avoiding corner portions of the rectangle, and protruding from the side surfaces of the individual piece 310-313 (410-413); an insulation layer 32 (42) containing a reinforcing filler, the insulation layer being provided each on a front surface and a back surface of the metal core substrate 31 (41); and a conductive pattern provided on a surface of the insulation layer 32 (42), the plurality of protruding pieces 321-328, 351-356 (421-428, 451-456) are provided to the side surfaces at intervals equal to a thickness of the protruding pieces 321-328, 351-356 (421-428, 451-456). According to an embodiment of the present disclosure, it is prevented that a burr produced by cutting the protruding pieces 321-328, 351-356 (421-428, 451-456) contacts the metal terminal 35 (45) and causes a short circuit.

Further, the printed wiring board PC comprises: a metal core substrate MC including an individual piece BG1-BG4 having a front surface, a back surface opposed to the front surface, and side surfaces connecting peripheries of the front surface and the back surface; an insulation layer IN containing a reinforcing filler, the insulation layer being provided each on a front surface and a back surface of the metal core substrate MC; and a wiring pattern provided to a surface of the insulation layer IN, the metal core substrate MC including a rolled Cu layer RC serving as a base and plating layers CP provided on both sides of the rolled Cu layer RC, the plating layers CP each having a rough surface. According to an embodiment of the present disclosure, it is possible to improve intimate contact of the insulation layer IN against a surface of the metal core substrate MC while ensuring stiffness of the printed wiring board PC.

Further, the printed wiring board 30 (40) comprises: a metal core substrate 31 (41) including a plurality of metal individual pieces 310-313 (410-413) each constituted by a front surface and a back surface having a shape of a rectangle, the individual pieces being arranged in a first direction and a second direction orthogonal to the first direction, and a plurality of protruding pieces 321-328, 351-356 (421-428, 451-456) made of a same material as a material of the individual pieces 310-313 (410-413) and provided integrally therewith, the protruding pieces avoiding corner portions of the rectangle and connecting side surfaces of individual pieces adjacent to each other in the individual pieces 310-313 (410-413), the protruding pieces including a first protruding piece 321, 324, 325, 328, 351, 353, 354, 356 (421, 424, 425, 428, 451, 453, 454, 456) adjacent to a corner portion of the rectangle, the first protruding piece being recessed in a direction opposite to the corner portion, the corner portion being included in the corner portions. According to an embodiment of the present disclosure, since the printed wiring board 30 (40) is not caught on something or warped due to the protruding piece 321, 324, 325, 328, 351, 353, 354, 356 (421, 424, 425, 428, 451, 453, 454, 456), workability when manufacturing the printed wiring board 30, 40 is enhanced.

Further, the printed wiring board 60 comprises: a metal core substrate 61 including an individual piece 610-613 having a front surface, a back surface, and four side surfaces, a plurality of protruding pieces 621-628, 651-656 protruding from the side surfaces of the individual piece 610-613; an insulation layer 62 provided on a front surface and a back surface of the metal core substrate 61 including the protruding pieces 621-628, 651-656; and a conductive pattern provided to the insulation layer 62, a metal terminal 65 being provided in a periphery of at least one of a front side and a back side of the printed wiring board 60, the metal terminal 65 having a potential different from a potential of the metal core substrate 61, the protruding pieces 621-628, 651-656 including a protruding piece close to the metal terminal 65, the protruding piece being formed in a direction of avoiding the metal terminal 65. According to an embodiment of the present disclosure, under a circumstance in which solder lies outside of the metal terminal 65, it is possible to prevent occurrence of a short circuit between the metal terminal 65 and the protruding pieces 621-628, 651-656 via solder.

Further, the printed wiring board PC comprises: a metal core substrate MC including an individual piece BG constituted by a front surface and a back surface having a shape of a rectangle, and four side surfaces connecting the front surface and the back surface, and a plurality of protruding pieces BG1-BG4 protruding outward from the side surfaces of the individual piece BG, the protruding pieces being integrally formed therewith; an insulation layer IN provided each on a front surface and a back surface of the metal core substrate MC; and a conductive pattern provided to the insulation layer IN, the printed wiring board including a device mounting region 56 in which a first image pickup device is provided, a device mounting region 56 in which a second image pickup device is provided, and a component mounting region 57 provided between the one device mounting region 56 and the other device mounting region, a mounting density of a conductive pattern on an inner layer corresponding to the component mounting region 57 being higher than a mounting density of a conductive pattern on an inner layer corresponding to the device mounting region 56. According to an embodiment of the present disclosure, stiffness of the printed wiring board PC can be enhanced.

Hereinabove, embodiments of the present disclosure have been described, but the present disclosure is not limited thereto. The foregoing materials, shapes, and arrangements of components are merely embodiments for implementing the present disclosure, and can be variously changed without departing from the gist the disclosure.

What is claimed is:

1. A rectangular printed wiring board for a camera module comprising:
   a metal core substrate including an individual piece having a rectangular front surface and a rectangular back surface, and four side surfaces connecting the front surface and the back surface;
   an insulation layer provided to each of a front surface and a back surface of the metal core substrate, the insulation layer being made of an insulating resin containing a filler; and
   a conductive pattern provided to the insulation layer provided each on the front surface and the back surface,
   the printed wiring board further comprising:
      a first mounting region being a mounting region of a first image pickup device, the first mounting region provided on one side in a longitudinal direction in a front surface of the printed wiring board, the first mounting region having a first conductive pattern provided therein, the first conductive pattern configured to be electrically connected to the first image pickup device,
      a second mounting region being a mounting region of a second image pickup device, the second mounting region provided on another side in the longitudinal direction in the front surface of the printed wiring board, the second mounting region having a second conductive pattern provided therein, the second conductive pattern configured to be electrically connected to the second image pickup device, and a component mounting region being a mounting region of a signal processing component, the component mounting region provided between the first mounting region and the second mounting region, the component mounting region having a third conductive pattern provided therein, the third conductive pattern configured to be electrically connected to the component, a mounting density of the third conductive pattern in the component mounting region being higher than a mounting density of the first conductive pattern in the first mounting region and a mounting density of the second conductive pattern in the second mounting region, in a plan view, wherein a cavity where a component is incorporated is not provided in the metal core substrate, through-holes and dummy holes are dispersed in substantially an entire area of the metal core substrate, the dummy holes are disposed to balance the through-holes and prevent warpage caused by non-uniform thermal expansion of the metal core, the insulation layer provided on the front surface of the metal core substrate is connected to the insulation layer provided on the back surface of the metal core substrate through the through-holes, a GND line is provided on an upper layer of the metal core substrate, a differential line is provided on a layer above the layer on which the GND line is provided, a first removal region is provided in a lower layer behind the first pickup device in the first mounting region, and a second removal region is provided in a lower layer behind the second pickup device in the second mounting region, the first removal region and the second removal region are regions where the GND line is removed to prevent capacitive coupling between the GND line and the differential line, the first image pickup device is provided in the first mounting region, the second image pickup device is provided in the second mounting region, and a passive component or a semiconductor element other than an image pickup device is provided in the component mounting region.

2. The printed wiring board according to claim 1, wherein the first conductive pattern, the second conductive pattern, and the third conductive pattern each are made of wiring or an electrode, and the first conductive pattern, the second conductive pattern, and the third conductive pattern are provided on an upper layer of the metal core substrate so as to overlap with the metal core substrate.

3. The printed wiring board according to claim 1, wherein the filler is in granular form, crushed form, short fiber form, or woven fiber sheet form.

4. The printed wiring board according to claim 1, wherein the metal core substrate includes a rolled copper layer, and a plating layer is provided to each on a front surface and a back surface of the rolled copper layer.

5. The printed wiring board according to claim 4, wherein the rolled copper layer has a thickness from 50 μm to 320 μm, and the plating layer is made of Cu and has a thickness from 6 μm to 320 μm.

6. The printed wiring board according to claim 1, wherein an area of the through-holes provided to the metal core substrate is set to 5% to 30% of an area of the metal core substrate.

7. The printed wiring board according to claim 1, wherein the insulation layer provided on the front surface of the metal core substrate is connected to the insulation layer provided on the back surface of the metal core substrate by completely filling the through-holes with the insulating resin.

* * * * *